United States Patent
Asada et al.

(10) Patent No.: US 8,199,936 B2
(45) Date of Patent: Jun. 12, 2012

(54) SIGNAL CONVERTER, OUTPUT AMPLIFYING DEVICE, AUDIO APPARATUS, AND TRANSMITTING AND RECEIVING SYSTEM

(75) Inventors: Kohei Asada, Kanagawa (JP); Tetsunori Itabashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 1180 days.

(21) Appl. No.: 10/967,529

(22) Filed: Oct. 18, 2004

(65) Prior Publication Data

US 2005/0089178 A1    Apr. 28, 2005

(30) Foreign Application Priority Data

Oct. 23, 2003    (JP) ................ P2003-363219

(51) Int. Cl.
    *H04R 3/00*    (2006.01)
(52) U.S. Cl. .......... 381/120; 330/10
(58) Field of Classification Search .......... 381/7, 20–23, 381/99, 80–85, 120; 330/10, 251, 207 A; 375/238–239; 700/94; 370/212–213; 329/312–313; 332/109

See application file for complete search history.

(56) References Cited

U.S. PATENT DOCUMENTS

| | | | | |
|---|---|---|---|---|
| 2,632,055 A | * | 3/1953 | Parker | 381/335 |
| 6,038,265 A | * | 3/2000 | Pan et al. | 375/316 |
| 6,243,472 B1 | * | 6/2001 | Bilan et al. | 381/117 |
| 6,288,605 B1 | * | 9/2001 | Botti et al. | 330/10 |
| 6,429,737 B1 | * | 8/2002 | O'Brien | 330/10 |
| 6,917,242 B2 | * | 7/2005 | Masuda et al. | 330/10 |
| 7,058,463 B1 | * | 6/2006 | Ruha et al. | 700/94 |
| 7,061,312 B2 | * | 6/2006 | Andersen et al. | 330/10 |
| 7,130,430 B2 | * | 10/2006 | Milsap | 381/77 |
| 7,221,297 B2 | * | 5/2007 | Ohkuri et al. | 341/120 |

FOREIGN PATENT DOCUMENTS

| | | |
|---|---|---|
| JP | 09-233591 A | 9/1997 |
| JP | 09233591 A  *  | 9/1997 |

* cited by examiner

*Primary Examiner* — Vivian Chin
*Assistant Examiner* — Fatimat O Olaniran
(74) *Attorney, Agent, or Firm* — Lerner, David, Littenberg, Krumholz & Mentlik, LLP

(57) ABSTRACT

Four speakers are matrix-connected to each other and a conversion circuit for converting audio signals of four channels into pulse width modulation signals of four channels that are time-divided so as to be complementary to matrix connection are provided. Four class-D output amplifiers receive the corresponding pulse width modulation signals output from the conversion circuit and outputs from the output amplifiers are supplied to the speakers.

15 Claims, 28 Drawing Sheets

FIG. 5

| | | Tc (Tc1) | | Tc (Tc2) | | Tc (Tc3) | | |
|---|---|---|---|---|---|---|---|---|
| A | RESOLUTION OF P31 | 6 BITS | | 6 BITS | | 6 BITS | | |
| | | Tc/2 | Tc/2 | | | | | |
| B | RESOLUTION OF P31 | 5 BITS | 5 BITS | 5 BITS | 5 BITS | 5 BITS | 5 BITS | |
| | | T1 | T2 | T1 | T2 | T1 | T2 | T1 |
| C | SP1 (VA | 0 | 1 | 1 | 3 | 2 | 3 | 2 |
| | VC) | 0 | 0 | 5 | 0 | 5 | 0 | 4 |
| | SP2 (VB | 0 | 3 | 0 | 6 | 0 | 4 | 5 |
| | VC) | 0 | 0 | 5 | 0 | 5 | 0 | 4 |
| | SP3 (VA | 0 | 1 | 1 | 3 | 2 | 3 | 2 |
| | VD) | 0 | 4 | 7 | 1 | 9 | 0 | 1 |
| | SP4 (VB | 0 | 3 | 0 | 6 | 0 | 4 | 5 |
| | VD) | 0 | 4 | 7 | 1 | 9 | 0 | 1 |
| D | S1, VA−VC | 1 | | −1 | | 0 | | ··· |
| | S2, VB−VC | | −2 | | 1 | | 5 | |
| | S3, VA−VD | | −9 | | −5 | | 4 | |
| | S4, VB−VD | −1 | | −2 | | −5 | | ··· |

FIG. 6

| | Tc1 | | Tc2 | | Tc3 | | |
|---|---|---|---|---|---|---|---|
| | T1 | T2 | T1 | T2 | T1 | T2 | |
| P31 → PA, VA<br>P33 → PC, VC | (*11) $\frac{0}{0}$ | (*12) $\frac{1}{0}$ | (*15) $\frac{1}{5}$ | (*16) $\frac{3}{0}$ | (*19) $\frac{2}{5}$ | $\frac{3}{0}$ | $\frac{2}{4}$ |
| P32 → PB, VB<br>P34 → PC, VC | $\frac{0}{0}$ | (*13) $\frac{3}{0}$ | (*14) $\frac{0}{5}$ | (*17) $\frac{6}{0}$ | (*18) $\frac{0}{5}$ | $\frac{4}{0}$ | $\frac{5}{4}$ |
| P31 → PA, VA<br>P34 → PD, VD | $\frac{0}{0}$ | (*23) $\frac{1}{4}$ | (*24) $\frac{1}{7}$ | (*27) $\frac{3}{1}$ | (*28) $\frac{2}{9}$ | $\frac{3}{0}$ | $\frac{2}{1}$ |
| P32 → PB, VB<br>P34 → PD, VD | (*21) $\frac{0}{0}$ | (*22) $\frac{3}{4}$ | (*25) $\frac{0}{7}$ | (*26) $\frac{6}{1}$ | (*29) $\frac{0}{9}$ | $\frac{4}{0}$ | $\frac{5}{1}$ |

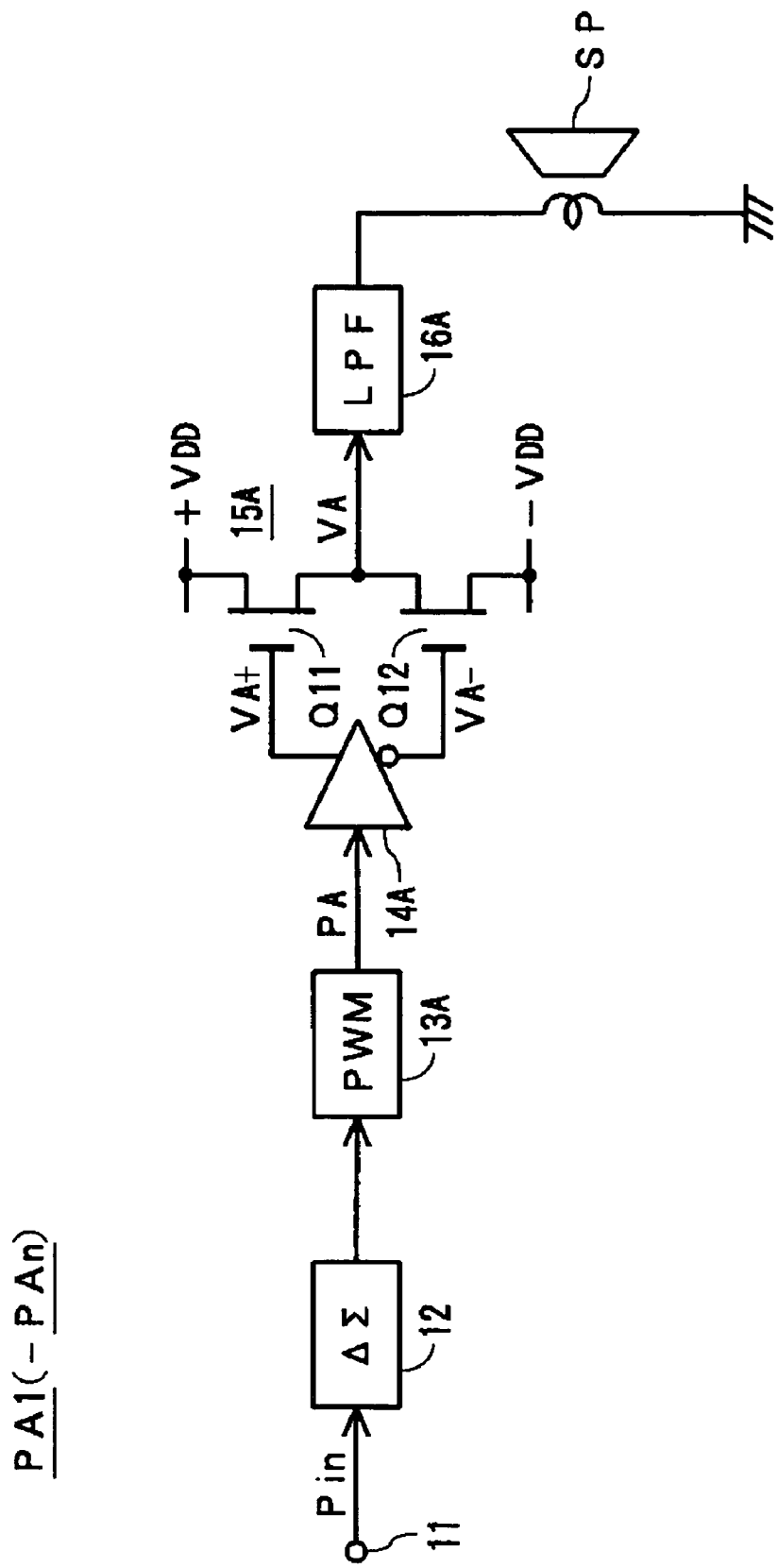

SIGNAL CONVERTER, OUTPUT AMPLIFYING DEVICE, AUDIO APPARATUS, AND TRANSMITTING AND RECEIVING SYSTEM

BACKGROUND OF THE INVENTION

1. Field of the Invention

The present invention relates to signal converters, output amplifying devices, audio apparatuses, and transmitting and receiving systems.

2. Description of the Related Art

Speaker arrays are used as speaker systems that are suitably applicable to home theaters or audio and visual (AV) systems. Wavefront synthesis is applied to such speaker arrays. Such speaker arrays can also be used for playback or control of sound fields.

FIG. 22 shows an example of sound field control by a speaker array 10. The speaker array 10 includes many speakers (speaker units) SP1 to SPn. In this case, for example, the number n of speakers is 256, and the speakers have a bore diameter of several centimeters. The speakers SP1 to SPn are actually arranged two-dimensionally on a plane. In the explanations below, however, they are arranged in a straight line in the horizontal direction, for the sake of simplification.

Audio signals are supplied from a signal source SC to delay circuits DL1 to DLn to be delayed by predetermined delay times τ1 to τn. The delayed audio signals are supplied to the corresponding speakers SP1 to SPn via corresponding power amplifiers PA1 to PAn. The delay times τ1 to τn for the delay circuits DL1 to DLn will be described below.

At any point, sound waves output from the speakers SP1 to SPn are synthesized and a sound pressure corresponding to the synthesized result can be acquired. Methods for setting a desired point in the sound field defined by the speakers SP1 to SPn shown in FIG. 22 as an increased sound pressure point Ptg, which is a point where the sound of the sound source SC is desired to be heard and is a point where sound pressure is higher than the surroundings, in other words, a point where sound pressure is increased, are broadly categorized into two methods shown in FIGS. 22 and 23.

The method shown in FIG. 22 is called a "focus type". In this case, the delay times τ1 to τn for the delay circuits DL1 to DLn are set to:

$\tau1=(Ln-L1)/s,$ $\tau2=(Ln-L2)/s,$ $\tau3=(Ln-L3)/s,$

.

.

.

$\tau n=(Ln-Ln)/s=0,$ where L1 to Ln represent distances from the speakers SP1 to SPn to the increased sound pressure point Ptg and s represents a sound velocity.

The audio signals output from the signal source SC are converted into sound waves and output delayed by the times τ1 to τn represented by the above equations from the speakers SP1 to SPn. Thus, all the sound waves reach the increased sound pressure point Ptg at the same time, and the sound pressure of the increased sound pressure point Ptg is larger than the surroundings.

In other words, in the system shown in FIG. 22, time differences between the sound waves caused by differences between path lengths from the speakers SP1 to SPn to the increased sound pressure point Ptg are compensated for by the delay circuits DL1 to DLn, so that sounds are focused on the increased sound pressure point Ptg.

The method shown in FIG. 23 is called a directional type. In this case, the delay times τ1 to τn for the delay circuits DL1 to DLn are set so that traveling waves (sound waves) output from the speakers SP1 to SPn have the same phase wavefront. Thus, the directivity is provided for the sound waves, and the directivity is in the direction of the increased sound pressure point Ptg. This system can also be regarded as a case where the distances L1 to Ln are infinite in the system of the focus type.

Each of power amplifiers PA1 to PAn used for the speaker array 10 may be class D power amplifiers. Each of the class D power amplifiers performs power amplification by switching operation and is arranged as shown in FIG. 24. In the class D power amplifier shown in FIG. 24, four output switching elements are bridge-connected to a speaker such that an output stage is arranged in a full-bridge configuration.

In other words, a digital audio signal Pin is supplied to a ΔΣ modulation circuit 12 via an input terminal 11 to be converted into a digital audio signal in which quantization noise in an audible band is suppressed and the number of bits is reduced, for example, the number of quantization bits is six. The digital audio signal is supplied to pulse width modulation (PWM) circuits 13A and 13B to be converted into a pair of PWM signals PA and PB, as shown in FIG. 25.

In this case, the pulse widths of the PWM signals PA and PB change in accordance with the level indicated by the input signal Pin (the level of an analog signal as the signal Pin for each sample, and the same applies to the following descriptions). Also, as shown in FIG. 25, the pulse width of the PWM signal PA corresponds to the level indicated by the input signal Pin, and the pulse width of the PWM signal PB corresponds to a 2's complement of the level indicated by the input signal Pin. Furthermore, rising edges of the PWM signals PA and PB are fixed at a starting point of a cycle period (reference period) Tc of the PWM signals PA and PB, and falling edges of the PWM signals PA and PB change in accordance with the level indicated by the input signal Pin.

The carrier frequency fc (=1/Tc) of each of the PWM signals PA and PB is, for example, sixteen times the sampling frequency fs of the input digital audio signal Pin. If the sampling frequency fs is 48 kHz, the following carrier frequency fc can be obtained:

$$fc=16fs=16\times 48 \text{ kHz}=768 \text{ kHz}.$$

The PWM signal PA is supplied to a drive amplifier 14A, and a pair of drive voltage VA+ having the same level as the signal PA and drive voltage VA− having the inverted level of the signal PA are generated, as shown in FIG. 25 and Part A of FIG. 26. The drive voltages VA+ and VA− are supplied to the gates of a pair of n-channel metal oxide semiconductor-field effect transistors (MOS-FETs) Q11 and Q12, respectively. The FETs Q11 and Q12 constitute a push-pull circuit 15A. The drain of the FET Q11 is connected to a power line of a positive power supply voltage +VDD, and the source of the FET Q22 is connected to the drain of the FET Q12. The source of the FET Q12 is connected to a power line of a negative power supply voltage −VDD.

The source of the FET Q11 and the drain of the FET Q12 are connected to one end of a speaker SP via a low-pass filter 16A.

Also, processing for the PWM signal PB from the PWM circuit 13B is similar to that for the PWM signal PA. In other words, when the PWM signal PB is supplied to a drive circuit 14B, a pair of drive voltage VB+ having the same level as the signal PB and drive voltage VB− having the inverted level of the signal PB are generated, as shown in Part B of FIG. 26. The drive voltages VB+ and VB− are supplied to the gates of a pair of n-channel MOS-FETs Q13 and Q14, respectively, that constitute a push-pull circuit 15B.

The source of the FET Q13 and the drain of the FET Q14 are connected to the other end of the speaker SP via a low-pass filter 16B.

Thus, when the voltage VA+ is high (H) and the voltage VA− is low (L), since the FET Q11 is turned on and the FET Q12 is turned off, a voltage VA of a node between the FETs Q11 and Q12 is +VDD, as shown in Part C of FIG. 26. In contrast, when the voltage VA+ is low and the voltage VA− is high, since the FET Q11 is turned off and the FET Q12 is turned on, the voltage VA is −VDD.

Similarly, when the voltage VB+ is high and the voltage VB− is low, since the FET Q13 is turned on and the FET Q14 is turned off, a voltage VB of a node between the FETs Q13 and Q14 is +VDD, as shown in Part D of FIG. 26. In contrast, when the voltage VB+ is low and the voltage VB− is high, since the FET Q13 is turned off and the FET Q14 is turned on, the voltage VB is −VDD.

During a period when the voltage VA is +VDD and the voltage VB is −VDD, a current i flows from the node between the FETs Q11 and Q12 to the node between the FETs Q13 and Q14 via a line including the low-pass filter 16A, the speaker SP, and the low-pass filter 16B, in that order, as shown in FIG. 24 and Part E of FIG. 26.

During a period when the voltage VA is −VDD and the voltage VB is +VDD, the current i flows from the node between the FETs Q13 and Q14 to the node between the FETs Q11 and Q12 via a line including the low-pass filter 16B, the speaker SP, and the low-pass filter 16A, in that order. During a period when the voltages VA and VB are +VDD and during a period when the voltages VA and VB are −VDD, the current i does not flow. In other words, the push-pull circuits 15A and 15B constitute a balanced transformerless (BTL) circuit.

The period when the current i flows changes in accordance with the period when the PWM signal PA or PB rises. Also, the current i is integrated by the low-pass filters 16A and 16B when the current i flows in the speaker SP. Thus, the current i flowing in the speaker SP is an analog current corresponding to the level indicated by the input signal Pin and is a power-amplified current. In other words, power-amplified output is supplied to the speaker SP.

Accordingly, the circuit shown in FIG. 24 operates such that the output stage functions as a full-bridge class D power amplifier. Since the FETs Q11 to Q14 perform power amplification by switching the power supply voltage between +VDD and −VDD, an enhanced power efficiency can be achieved. Thus, in the speaker array 10 that requires the many power amplifiers PA1 to PAn, the amplifier shown in FIG. 24 is suitable as the power amplifiers PA1 to PAn.

FIG. 27 shows a case where an output stage of a class D power amplifier is arranged in a half-bridge configuration in which a pair of switching elements is connected in series with each other such that output is acquired from a connection middle point of the switching elements. In this case, the voltage VA shown in Part C of FIG. 26 is acquired at the node between the FETs Q11 and Q12, and the voltage VA is supplied to the speaker SP via the low-pass filter 16A.

Thus, in the amplifier described above, power-amplified output is also supplied to the speaker SP. Also, since power amplification is performed by switching the power supply voltage between +VDD and −VDD, an enhanced power supply efficiency can be achieved. Thus, in the speaker array 10 that requires the many power amplifiers PA1 to PAn, the amplifier shown in FIG. 27 is suitable as the power amplifiers PA1 to PAn.

An example of the known technology is disclosed in Japanese Unexamined Patent Application Publication No. 9-233591.

When the power amplifiers PA1 to PAn for the speaker array 10 are class D power amplifiers, as described above, the class D power amplifiers PA1 to PAn are connected to the speakers SP1 to SPn, as shown in FIG. 28A or 28B (FIGS. 28A and 28B show the speakers SP1 to SPn from the rear side, in other words, FIGS. 28A and 28B are illustrations viewed from a connection terminal side). For the sake of simpler explanation, four speakers SP1 to SP4 constitute the speaker array 10 and the speakers SP1 to SP4 are arranged in a two-row by two-column matrix, as shown in FIG. 29 (FIG. 29 is an illustration viewed from the front side).

When the amplifiers PA1 to PA4 are arranged in a full-bridge configuration, as shown in FIG. 24, eight speaker cables are needed, as shown in FIG. 28A. When the amplifiers PA1 to PA4 are arranged in a half-bridge configuration, as shown in FIG. 27, five speaker cables are needed, as shown in FIG. 28B. In other words, when the output stage including n output amplifiers PA1 to PAn is arranged in a full-bridge configuration, 2 n speaker cables are required. When the output stage including n output amplifiers PA1 to PAn is arranged in a half-bridge configuration, (n+1) speaker cables are required.

Thus, when n represents 256, if the power amplifiers PA1 to PA256 are arranged in a full-bridge configuration, 512 speaker cables must be routed. Also, if the power amplifiers PA1 to PA256 are arranged in a half-bridge configuration, 257 speaker cables must be routed. Routing such a large number of cables is troublesome, and is not practical.

If a part including the delay circuits DL1 to DL256 and the power amplifiers PA1 to PA256 shown in FIG. 22 or 23 are arranged in a speaker box, only two cables (a pair of cables) for supplying an audio signal from the signal source SC to the speaker box appear outside the speaker box. In this case, however, the number of cables between the power amplifiers PA1 to PA256 and the speakers SP1 to SP256 inside the speaker box is still large. This involves tremendous amount of time and labor for wiring and assembling.

SUMMARY OF THE INVENTION

In order to solve the above problems, an output amplifying device according to the present invention includes a conversion circuit for performing conversion processing for converting audio signals of p×q channels into pulse width modulation signals of p+q channels; and p+q output amplifiers to which the corresponding pulse width modulation signals of p+q channels output from the conversion circuit are supplied. Outputs from the p output amplifiers and outputs from the q output amplifiers, from among the p+q output amplifiers, are differentially supplied to corresponding p×q speakers.

According to the present invention, if m×m speakers are used, the speakers can be connected to output amplifiers using 2 m speaker cables. Thus, the number of speaker cables can be reduced, and connection and assembling can be performed easily.

BRIEF DESCRIPTION OF THE DRAWINGS

FIG. 5 is an illustration for explaining the present invention;

FIG. 6 is an illustration for explaining the present invention;

FIG. 27 is a connection diagram of a known technology;

DESCRIPTION OF THE PREFERRED EMBODIMENTS (I) Entire Structure and Operation

Figure 1:
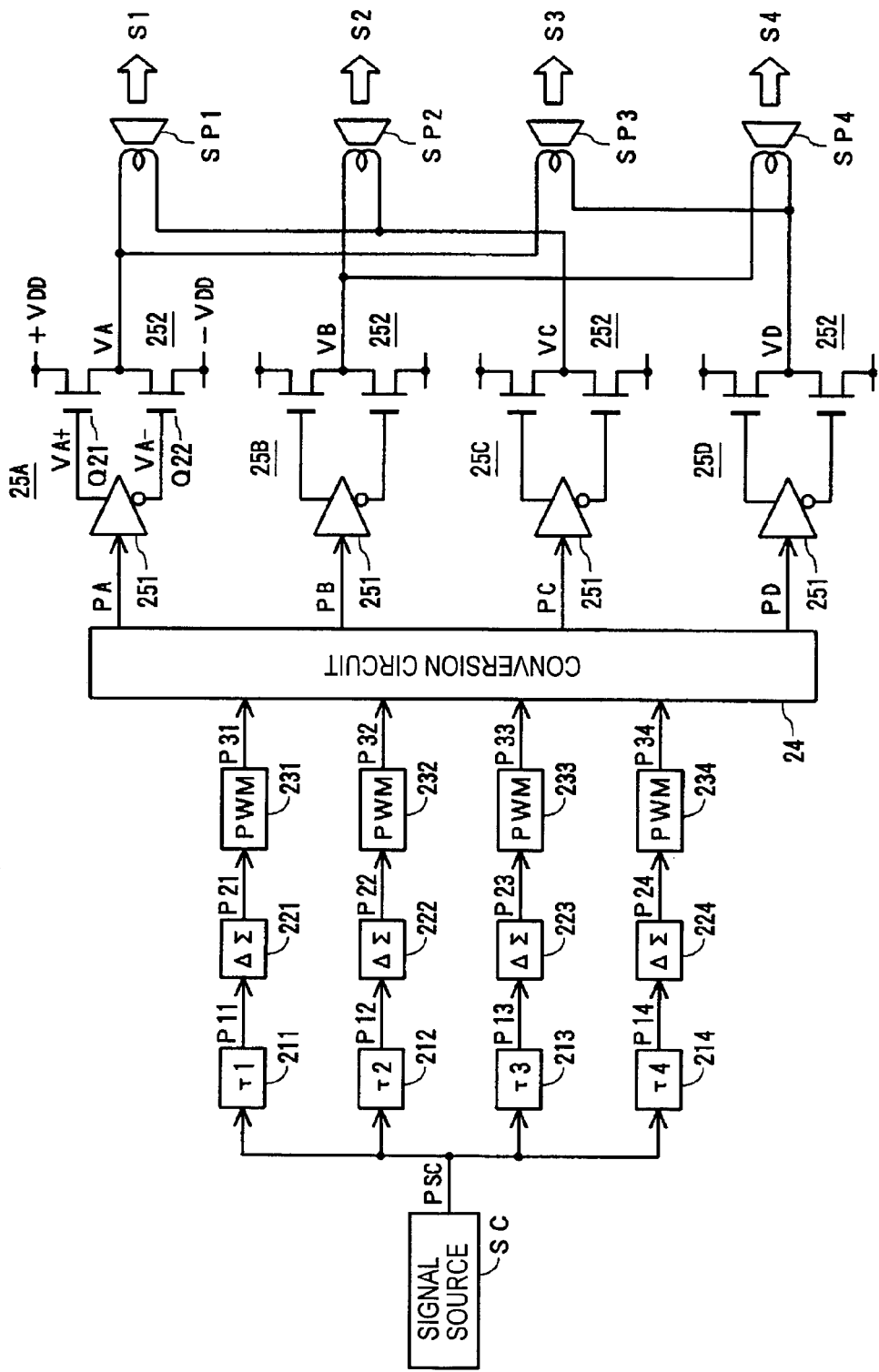
FIG. 1 is a connection diagram according to an embodiment of the present invention.

FIG. 1 shows an example of the present invention. In this example, for the sake of simpler explanation, a speaker array 10 includes speakers SP1 to SP4 (n represents 4 (=2×2) for speakers SP1 to SPn).

Figure 2:
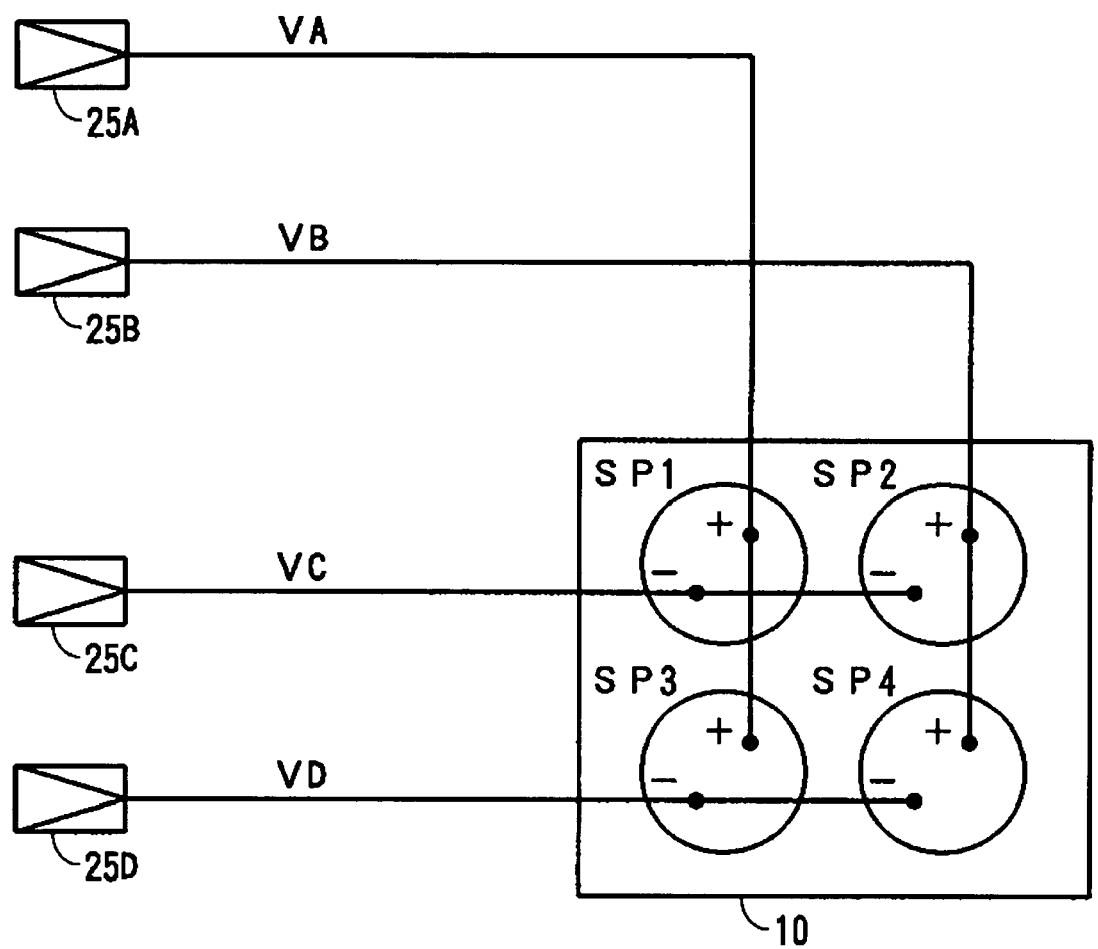
FIG. 2 is a connection diagram for explaining the present invention.

The four speakers SP1 to SP4 are arranged in a two-row by two-column matrix, as shown in FIG. 2. FIG. 2 shows the speakers SP1 to SP4 from the rear side, in other words, FIG. 2 is an illustration viewed from a connection terminal side. The speakers SP1 and SP2 define the first row, and the speakers SP3 and SP4 define the second row. Also, the speakers SP1 and SP3 define the first column, and the speakers SP2 and SP4 define the second column. Also, as shown in FIG. 1, S1 to S4 represent sounds output from the speakers SP1 to SP4, respectively.

Figure 22:
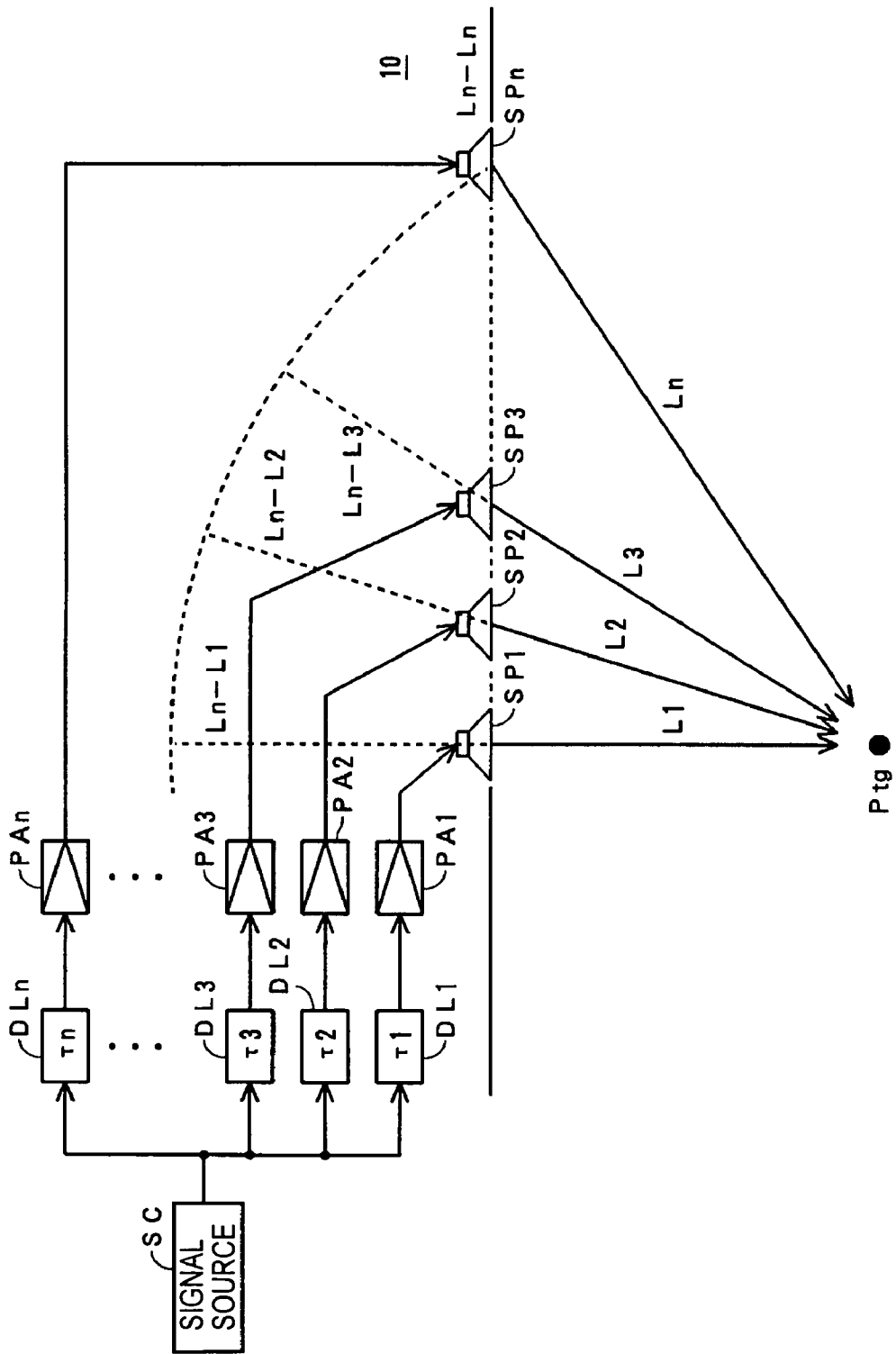
FIG. 22 shows a focus-type speaker array.
Figure 23:
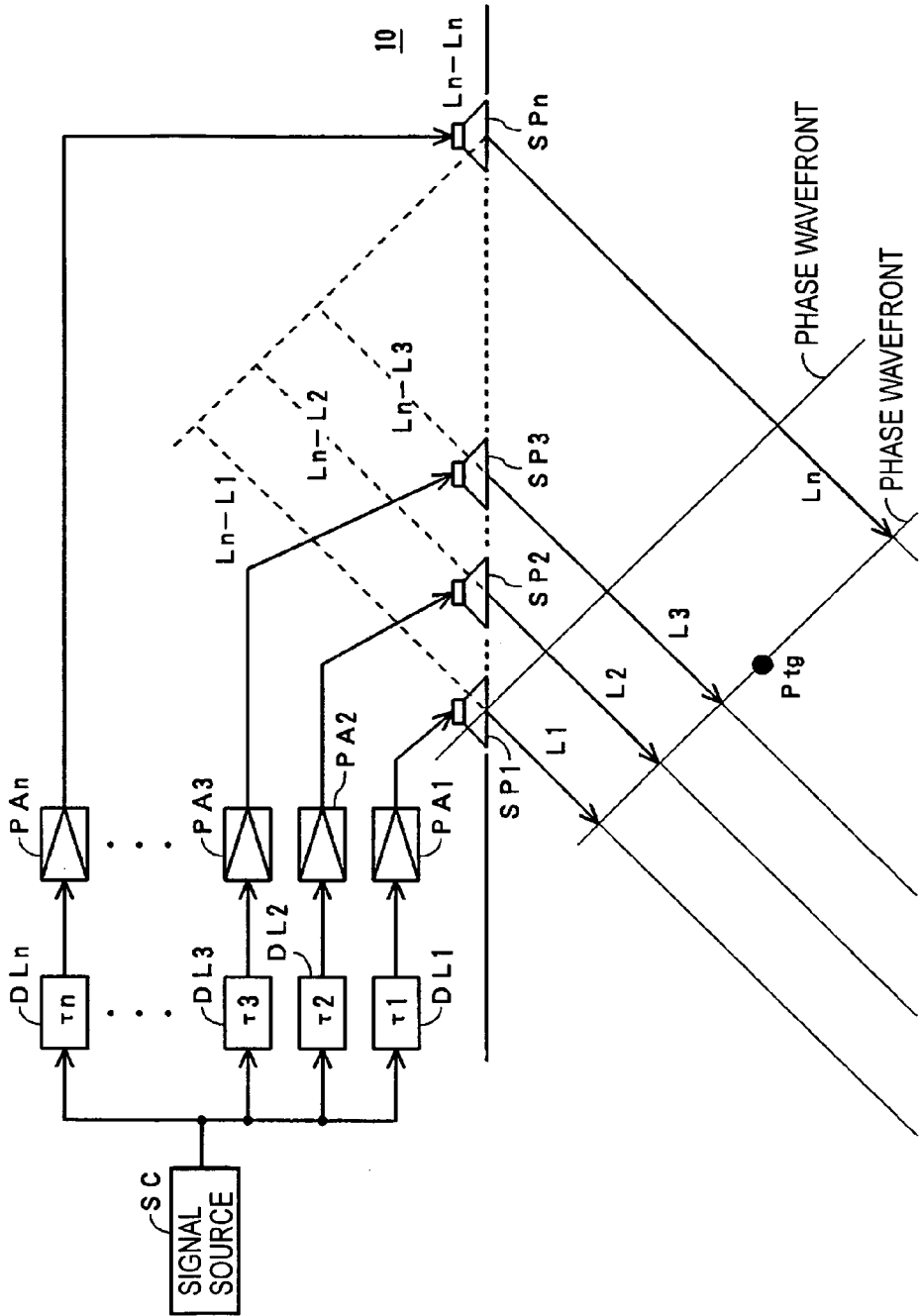
FIG. 23 shows a directional-type speaker array.

Referring to FIG. 1, a digital audio signal PSC is extracted from a signal source SC. The digital audio signal PSC is supplied to delay circuits 211 to 214, and four-channel digital audio signals P11 to P14 delayed by predetermined times $\tau 1$ to $\tau 4$, respectively, are generated. In this case, the delay times $\tau 1$ to $\tau 4$ are values for realizing the focus-type or directional-type speaker array 10 explained with reference to FIG. 22 or 23.

The audio signals P11 to P14 are supplied to $\Delta\Sigma$ modulation circuits 221 to 224 to be converted into digital audio signals P21 to P24 in which quantization noise in an audible band is suppressed and the number of bits is reduced, for example, the number of quantization bits is six. The digital signals P21 to P24 are supplied to pulse width modulation (PWM) circuits 231 to 234 to be converted into PWM signals P31 to P34.

Figure 3:
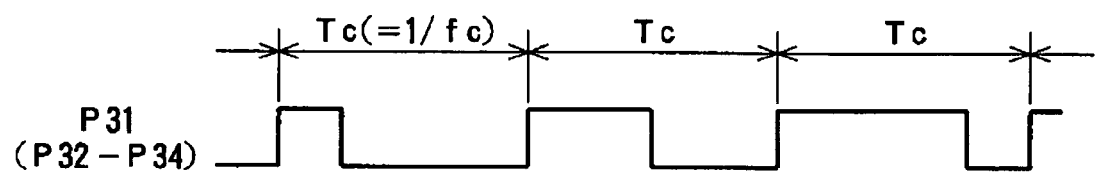
FIG. 3 is a waveform chart for explaining the present invention.

In this case, as shown in FIG. 3, the pulse widths of the PWM signals P31 to P34 change with a 6-bit resolution in accordance with the level indicated by the input audio signal PSC (the level of an analog signal as the signal PSC for each sample, and the same applies to the following descriptions). Also, rising edges of the PWM signals P31 to P34 are fixed at a starting point of a cycle period Tc of the PWM signals P31 to P34, and falling edges of the PWM signals P31 to P34 change in accordance with the level indicated by the input audio signal PSC.

The carrier frequency fc (=1/Tc) of each of the PWM signals P31 to P34 is, for example, sixteen times the sampling frequency fs of the input audio signal PSC. If the sampling frequency fs is 48 kHz, the following carrier frequency fc can be obtained:

$$fc=16fs=16\times 48\ kHz=768\ kHz.$$

For a known system, the PWM signals P31 to P34 are class D power-amplified, supplied to the speakers SP1 to SP4, and then output as the sounds S1 to S4.

Figure 4:
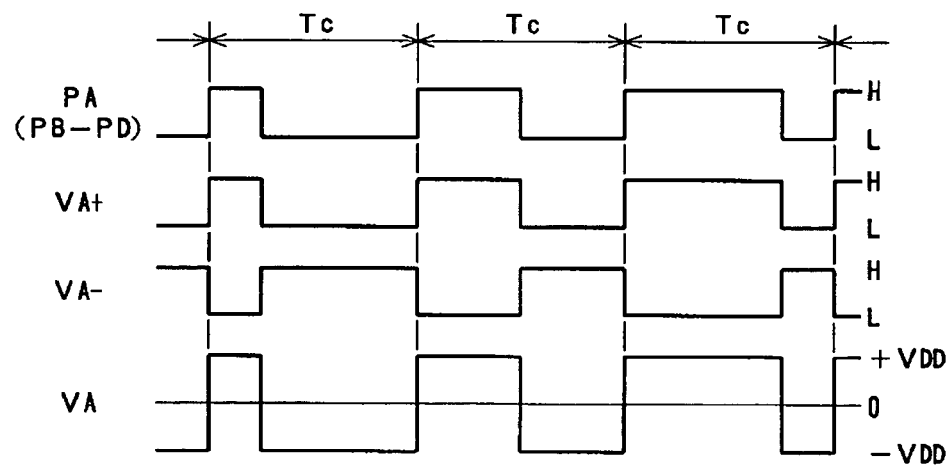
FIG. 4 is a waveform chart for explaining the present invention.

In the system shown in FIG. 1, however, the PWM signals P31 to P34 are supplied to a conversion circuit 24 to be converted into predetermined PWM signals PA to PD, for example, as shown in FIG. 4. The conversion circuit 24 and the PWM signals PA to PD will be described below. The conversion circuit 24 time-divides the PWM signals P31 to P34 to be converted into the PWM signals PA to PD.

The PWM signal PA, from among the PWM signals PA to PD, is supplied to an output amplifier 25A. The output amplifier 25A includes a drive circuit 251 and a push-pull circuit 252 for class D power amplification. Thus, the PWM signal PA is supplied to the drive circuit 251, a pair of drive voltage VA+ having the same level as the PWM signal PA and drive voltage VA− having the inverted level of the PWM signal PA are generated, as shown in FIG. 4, and the drive voltages VA+ and VA− are supplied to the push-pull circuit 252.

The push-pull circuit 252 includes a pair of n-channel MOS-FETs Q21 and Q22. The drive voltages VA+ and VA− are supplied to the gates of the FETs Q21 and Q22, respectively. The drain of the FET Q21 is connected to a power line of a positive power supply voltage +VDD, and the source of the FET Q21 is connected to the drain of the FET Q22. The source of the FET Q22 is connected to a power supply line of a negative power supply voltage −VDD.

Also, the PWM signals PB to PD from the conversion circuit 24 are supplied to output amplifiers 25B to 25D each having an arrangement similar to the output amplifier 25A.

The speaker SP1 is connected between an output terminal of the output amplifier 25A and an output terminal of the output amplifier 25C, and the speaker SP2 is connected between an output terminal of the output amplifier 25B and the output terminal of the output amplifier 25C. Also, the speaker SP3 is connected between the output terminal of the output amplifier 25A and an output terminal of the output amplifier 25D, and the speaker SP4 is connected between the output terminal of the output amplifier 25B and the output terminal of the output amplifier 25D.

Normally, low-pass filters are connected between the output amplifiers 25A to 25D and the speakers SP1 to SP4. Connection of the low-pass filters will be described below.

With this arrangement, as shown in FIG. 4, when the voltage VA+ is high and the voltage VA− is low, the FET Q21 is turned on and the FET Q22 is turned off. In contrast, when the voltage VA+ is low and the voltage VA is high, the FET Q21 is turned off and the FET Q22 is turned on. Thus, the output voltage VA obtained by class D power-amplifying the PWM signal PA is extracted at the output terminal of the push-pull circuit 252, as shown in FIG. 4. Also, the output voltages VB to VD obtained by class D power-amplifying the PWM signals PB to PD are extracted from the output amplifiers 25B to 25D, respectively.

Thus, a difference voltage (VA−VC) between the voltage VA and the voltage VC is supplied to the speaker SP1, and the sound S1 is output from the speaker SP1 in accordance with the difference voltage (VA−VC). Also, a difference voltage (VB−VC) between the voltage VB and the voltage VC is supplied to the speaker SP2, and the sound S2 is output from the speaker SP2 in accordance with the difference voltage (VB−VC). Also, a difference voltage (VA−VD) between the voltage VA and the voltage VD is supplied to the speaker SP3, and the sound S3 is output from the SP3. A difference voltage (VB−VD) between the voltage VB and the voltage VD is supplied to the speaker SP4, and the sound S4 is output from the speaker SP4.

When differences in configurations among the signals P31 to P34, the signals PA to PD, the voltages VA to VD, and the sounds S1 to S4 are ignored and only information included in the signals P31 to P34, the signals PA to PD, the voltages VA to VD, and the sounds S1 to S4 is considered, the following equations are obtained:

$$S1=VA-VC$$
$$S2=VB-VC$$
$$S3=VA-VD$$
$$S4=VB-VD \quad (1).$$

Then, the following equations are obtained:

$$VA=PA$$
$$VB=PB$$
$$VC=PC$$
$$VD=PD \quad (2).$$

Thus, from equations (1) and (2), the following equations are obtained:

$$S1=PA-PC$$
$$S2=PB-PC$$
$$S3=PA-PD$$
$$S4=PB-PD \quad (3).$$

Also, since the focus-type or the directional-type speaker array 10 is realized when signals obtained by class D power-amplifying the PWM signals P31 to P34 are supplied to the speakers SP1 to SP4, the following equations are obtained:

$$S1=P31$$
$$S2=P32$$
$$S3=P33$$
$$S4=P34 \quad (4).$$

Thus, from equations (3) and (4), the following equations are obtained:

$$P31=PA-PC$$
$$P32=PB-PC$$
$$P33=PA-PD$$
$$P34=PB-PD \quad (5).$$

Thus, as described below, when the PWM signals P31 to P34 are converted into the PWM signals PA to PD in the conversion circuit 24, if conversion that satisfies equation (5), in other words, if conversion that is complementary to matrix connection of the speakers SP1 to SP4, is performed, the PWM signals P31 to P34 are class D power-amplified to be supplied to the speakers SP1 to SP4. Accordingly, the focus-type or directional-type speaker array 10 is realized.

According to the system shown in FIG. 1, class D power-amplified voltages can be supplied to the speakers SP1 to SP4 in the speaker array 10. In this case, as shown in FIG. 2, only 4 (2+2) speaker cables are used for connection between the output amplifiers 25A to 25D and the speakers SP1 to SP4. Alternatively, if the number n of speakers is 256, since 256 is obtained by the equation: 256=16×16, the output amplifiers can be connected to the speakers using 32 (=16+16) speaker cables.

In other words, generally, when the number n of speakers is represented by the equation: n=m×m, output amplifiers can be connected to speakers using 2 m speaker cables. Thus, the number of speaker cables can be reduced, and connection and assembling can be easily performed.

(II) Conversion Circuit 24

A case where the number n of speakers is four, which is explained with reference to FIGS. 1 to 4, will be described. Hereinafter, the cycle period Tc of each of the PWM signals P31 to P34 is represented by periods Tc1, Tc2, Tc3, or the like as necessary. Furthermore, although the voltages VA to VD output from the output amplifiers 25A to 25D are PWM waveforms, they are regarded as analog voltages for the sake of simplification. Also, the unit of the analog voltages is omitted here.

As explained with reference to FIG. 3, the resolution of each of the PWM signals P31 to P34 at the cycle period Tc is 6 bits, as shown in Part A of FIG. 5. If the cycle period Tc is equally divided into a first half period T1 and a last half period T2, the resolution of the PWM signal P31 at the period T1 is 5 bits and the resolution of the PWM signal P31 at the period T2 is 5 bits, as shown in Part B of FIG. 5.

The polarities and levels of the sounds S1 to S4 output from the speakers SP1 to SP4 change in accordance with the PWM signals P31 to P34, respectively, as shown in, for example, Part D of FIG. 5. In other words, the speakers SP1 to SP4 are required to output the sounds S1 to S4 whose polarities and levels change, as shown in Part D of FIG. 5, in accordance with the PWM signals P31 to P34, respectively. However, as shown in Part D of FIG. 5, the sounds S2 and S3 are delayed with respect to the sounds S1 and S4 by a period Tc/2.

As shown in the first row of Part C of FIG. 5, if, at the first half period T1 of the period Tc1, the voltage VA is 0 and the voltage VC is 0 and, at the last half period T2 of the period Tc1, the voltage VA is 1 and the voltage VC is 0, an integration value of a difference voltage (VA−VC) supplied to the speaker SP1 at the period Tc1 is obtained, as shown in Part D of FIG. 5, by the following equation:

$$(0-0)+(1-0)=1.$$

Also, if, at the first half period T1 of the period Tc2, the voltage VA is 1 and the voltage VC is 5 and, at the last half period T2 of the period Tc2, the voltage VA is 3 and the voltage VC is 0, an integration value of a difference voltage (VA−VC) at the period Tc2 is obtained by the following equation:

$$(1-5)+(3-0)=-1.$$

Furthermore, if, at the first half period T1 of the period Tc3, the voltage VA is 2 and the voltage VC is 5 and, at the last half period T2 of the period Tc3, the voltage VA is 3 and the voltage VC is 0, an integration value of a difference voltage (VA−VC) at the period Tc3 is obtained by the following equation:

$$(2-5)+(3-0)=0.$$

In other words, if the voltages VA and VC are changed as shown in the first row of Part C of FIG. 5, an integration value of a difference voltage (VA−VC) for the period Tc changes as shown in the first row of Part D of FIG. 5. Here, in accordance with equation (1): S1=VA−VC, if the voltages VA and VC are changed as shown in the first row of Part C of FIG. 5, an intended sound S1 is output from the speaker SP1, as shown in the first row of Part D of FIG. 5.

Also, if the voltages VB and VC are changed as shown in the second row of Part C of FIG. 5, when a last half period T2 and the subsequent first half period T1 is regarded as a pair of periods, an integration value of a difference voltage (VB−VC) at the pair of periods (T2+T1) changes as shown in the second row of Part D of FIG. 5. Here, in accordance with equation (1): S2=VB−VC, if the voltages VB and VC are changed as shown in the second row of Part C of FIG. 5, an intended sound S2 is output from the speaker SP2, as shown in the second row of Part D of FIG. 5.

Similarly, if the voltages VA, VB, and VD are changed as shown in Part C of FIG. 5, in accordance with equations (1): S3=VA−VD and S4=VB−VD, intended sounds S3 and S4 are output from the speakers SP3 and SP4, respectively.

As shown by equations (2): VA=PA, VB=PB, VC=PC, and VD=PD, if values represented by the PWM signals PA to PD are changed in accordance with the PWM signals P31 to P34 as shown in Part C of FIG. 5, sounds S1 to S4 are output. In other words, the conversion circuit 24 converts the PWM signals P31 to P34 into the PWM signals PA to PD that are time-divided, as shown in Part C of FIG. 5.

The conversion circuit 24 performs the conversion described above in accordance with a sequence, for example, shown in FIG. 6. FIG. 6 is an illustration in which signs (*11) to (*29) for explaining a processing order are added to Part C of FIG. 5.

In other words, the following processing is performed:

(A) The Fast Half Period T1 of the Period Tc1

The signals PA and PC; and PB and PD are set to initial values (*11) and (*21), respectively.

(B) The Last Half Period T2 of the Period Tc1

A value (*12) is determined from values of the signals P31 and P33 at the period Tc1 and the value (*11).

Similarly, a value (*22) is determined from values of the signals P32 and P34 at the period Tc1 and the value (*21). Here, values (*13) and (*23) are automatically determined from the values (*12) and (*22).

(C) The First Half Period T1 of the Period Tc2

Values (*14) and (*24) are determined from the values of the signals P31 to P34 at the period Tc1 and the values (*13) and (*23). Here, values (*15) and (*25) are automatically determined.

(D) The Last Half Period T2 of the Period Tc2

Values (*16) and (*26) are determined from the values of the signals P31 to P34 at the period Tc2 and the values (*15) and (*25). Here, values (*17) and (*27) are automatically determined.

(E) The First Half Period T1 of the Period Tc3 and the Subsequent Periods

Processing similar to processing (C) and (D) is alternately repeated.

Accordingly, the values shown in Part C of FIG. 5 can be allocated. Thus, the PWM signals P31 to P34 are converted into the PWM signals PA to PD.

In other words, for each half-cycle period (period T1 or T2) of the cycle period Tc of the PWM signals P31 to P34, values of the signals PA to PD at the half-cycle period (period T1 or T2) are determined from values of the signals P31 to P34 at the period Tc and from the signals PA to PD at the half cycle period (period T2 or T1) immediately before.

In this case, the signals PA to PD cannot be uniquely determined from the signals P31 to P34. However, the signals P31 to P34 are converted into signals PA to PD over several periods Tc, and a group of signals PA to PD that is most appropriate from among a plurality of groups of signals PA to PD, for example, a group in which all the signals PA to PD are 5 bits or less is output as a conversion result.

Figure 7:
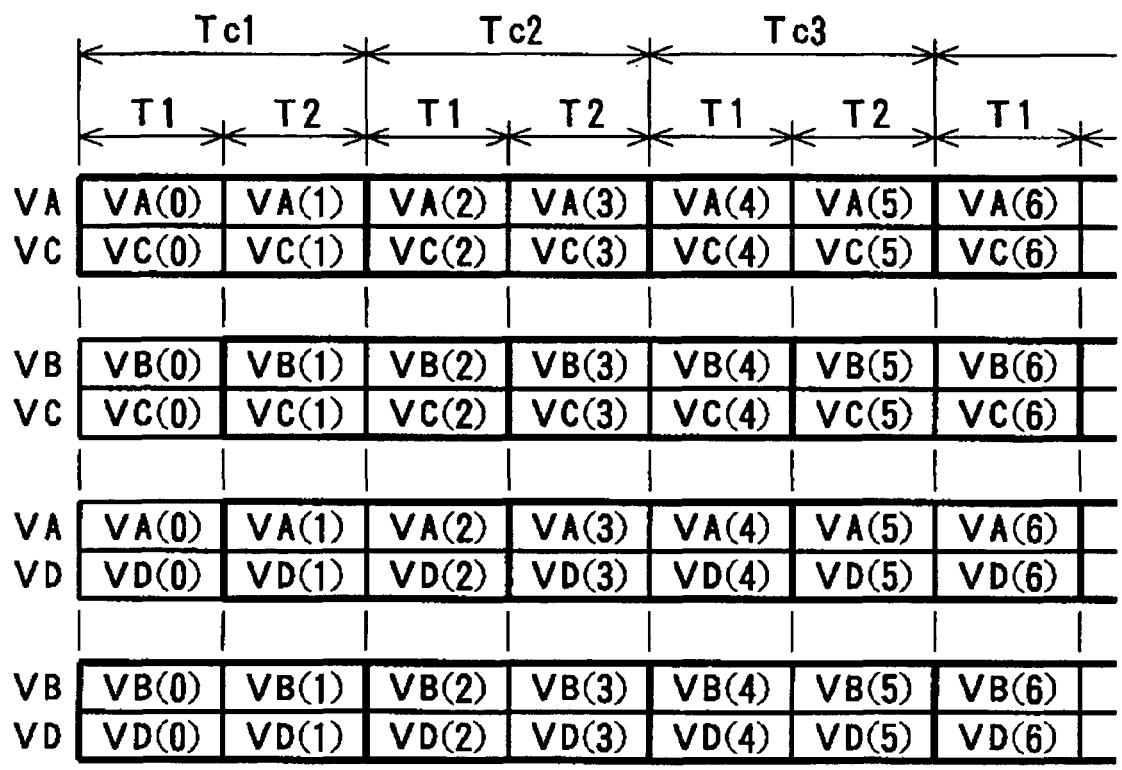
FIG. 7 is an illustration for explaining the present invention.

From the above descriptions, the following things can be said. Values of the signals PA to PD at the periods T1 and T2 of the cycle period Tc are as shown in FIG. 7. When i represents an ordinal number in a time series at a period Tc/2 and j represents an ordinal number in a time series at a period Tc, that is, when i and j are 0, 1, 2, 3, . . . , if i is 0, 2, 4 . . . and j is i/2, the following equations are satisfied:

$$PA(i)VA+(i+1)-PC(i)-PC(i+1)=P31(j) \quad (11)$$

$$PB(i)VB+(i+1)-PD(i)-PD(i+1)=P34(j) \quad (14),$$

and if i is 1, 3, 5, . . . and j is (i−1)/2, the following equations are satisfied:

$$PB(i)VB+(i+1)-PC(i)-PC(i+1)=P32(j) \quad (12)$$

$$PA(i)VA+(i+1)-PD(i)-PD(i+1)=P32(j) \quad (13).$$

Thus, conversion into intended signals PA to PD are realized by sequentially obtaining a value sequence that satisfies equations (11) to (14). Although there are various procedures for obtaining such a value sequence, they are not described here. For example, such a value sequence can be obtained in accordance with the procedure explained with reference to FIG. 6.

In other words, if an initial value when i is 0 is determined in advance, signals PA(1) and PC(1) that satisfy equation (11) and signals PB(1) and PD(1) that satisfy equation (14) when i is 0 are obtained. In this case, each signal is not uniquely determined, and many combinations of signals exist.

Then, signals PB(2) and PC(2) that satisfy equation (12) and signals PA(2) and PD(2) that satisfy equation (13) when i is 1 are obtained. In this case, many combinations of signals also exist.

Then, when i is 2 or more, signals PA to PD can be obtained by repeating the processing described above.

In this case, however, although there are many combinations of signals as described above, a randomly selected combination of signals may exceed a size that can be represented using a given number of bits (in this case, 5 bits). For example, even if a small difference voltage (VA−VC) is output, subtraction of the signals PA and PC of large values may be required. In this case, the signals PA and PC cannot be represented by a given number of bits.

Thus, for example, preferably, signals PA to PD are selected by prereading the signals P31 to P34 such that the converted signals PA to PD do not exceed a given number of bits and such that a value represented by the entire signals PA to PD is in a direction of convergence into 0. In order to realize such conversion processing, the conversion circuit 24 may include a memory for prereading the signals P31 to P34, a table for converting values of the signals P31 to P34 into values of the signals PA to PD, and a central processing unit (CPU) or a digital signal processor (DSP) for executing the conversion processing using the table.

(III) Correction of Time Delay

For the conversion circuit 24 described above, the sounds S2 and S3 are delayed with respect to the sounds S1 and S4 by a period Tc/2, as shown in Part D of FIG. 5. Since this amount of delay is sufficiently smaller than a period and a sampling period of an audio signal, this does not directly cause an auditory problem. For example, for the example of the values described above, the amount of delay Tc/2 of the sounds S2 and S3 is approximately 0.65 μs. If the frequency of an audio signal is 20 kHz, a period is 50 μs and a sampling period is approximately 20.8 μs. Thus, the amount of delay of the sounds S2 and S3 does not directly cause an auditory problem.

However, since the speaker array 10 uses time delays or phase delays of the sounds S1 to S4 output from the speakers SP1 to SP4, a case where the amount of delays is corrected will be described.

Figure 8:
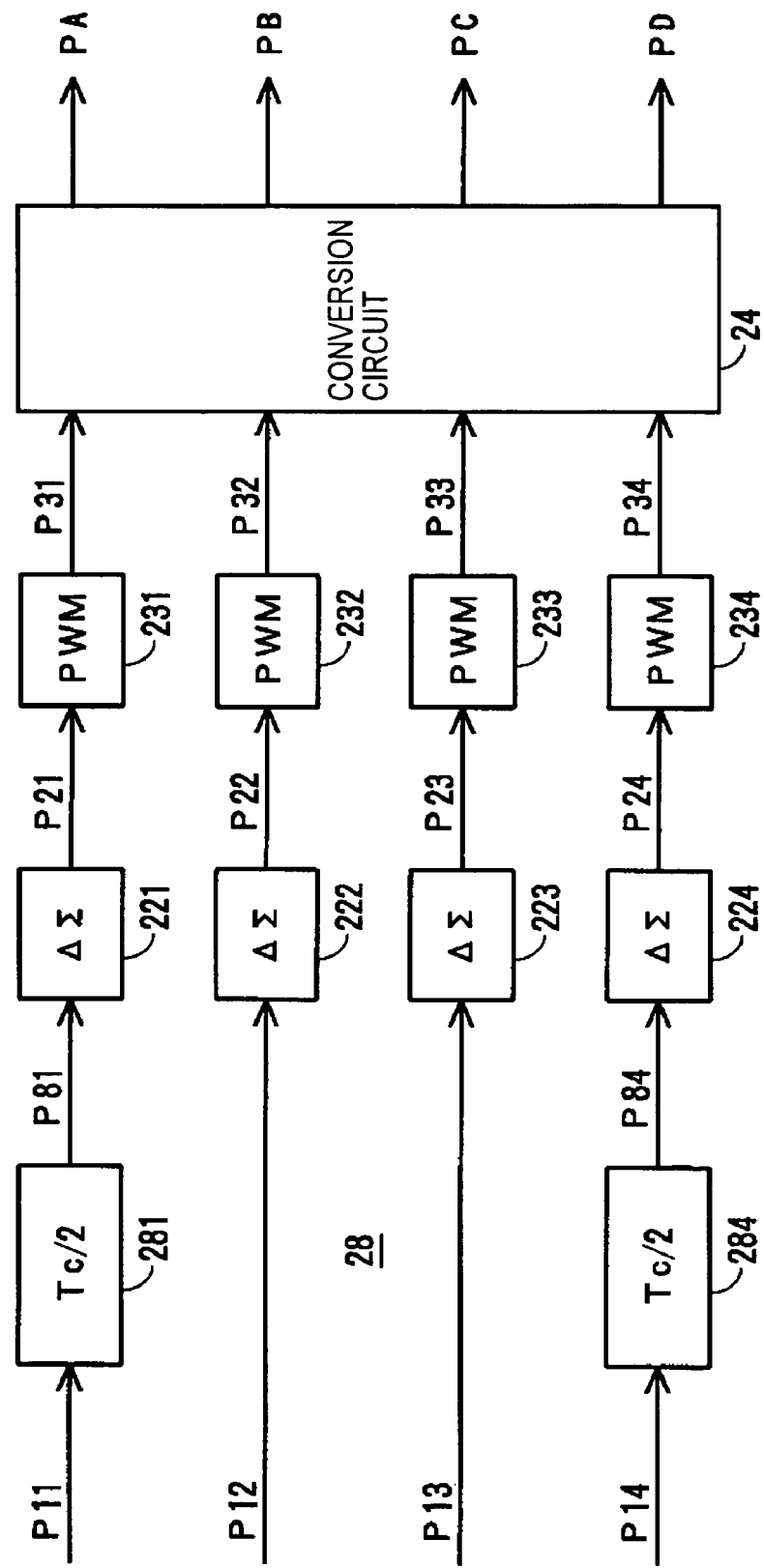
FIG. 8 is a connection diagram showing a part of another embodiment of the present invention.
Figure 9:
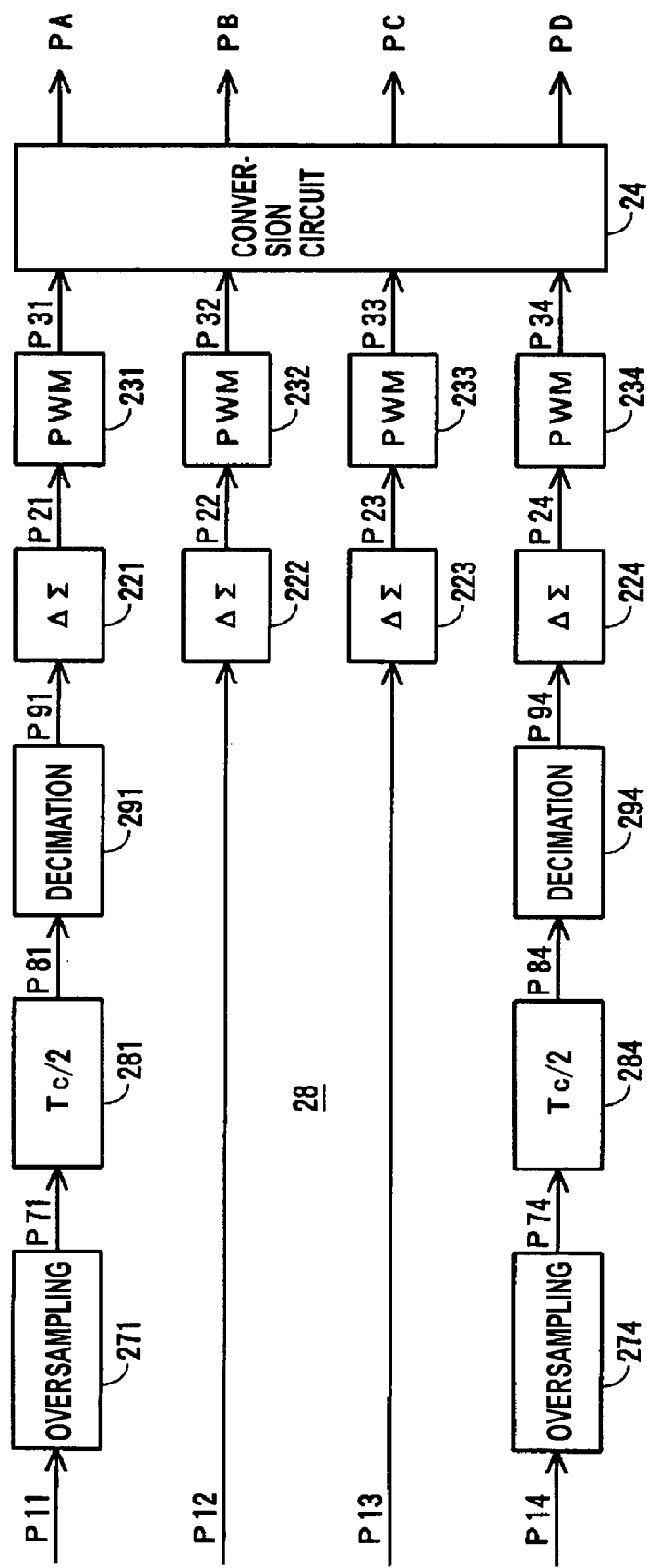
FIG. 9 is a connection diagram showing a part of another embodiment of the present invention.
Figure 10:
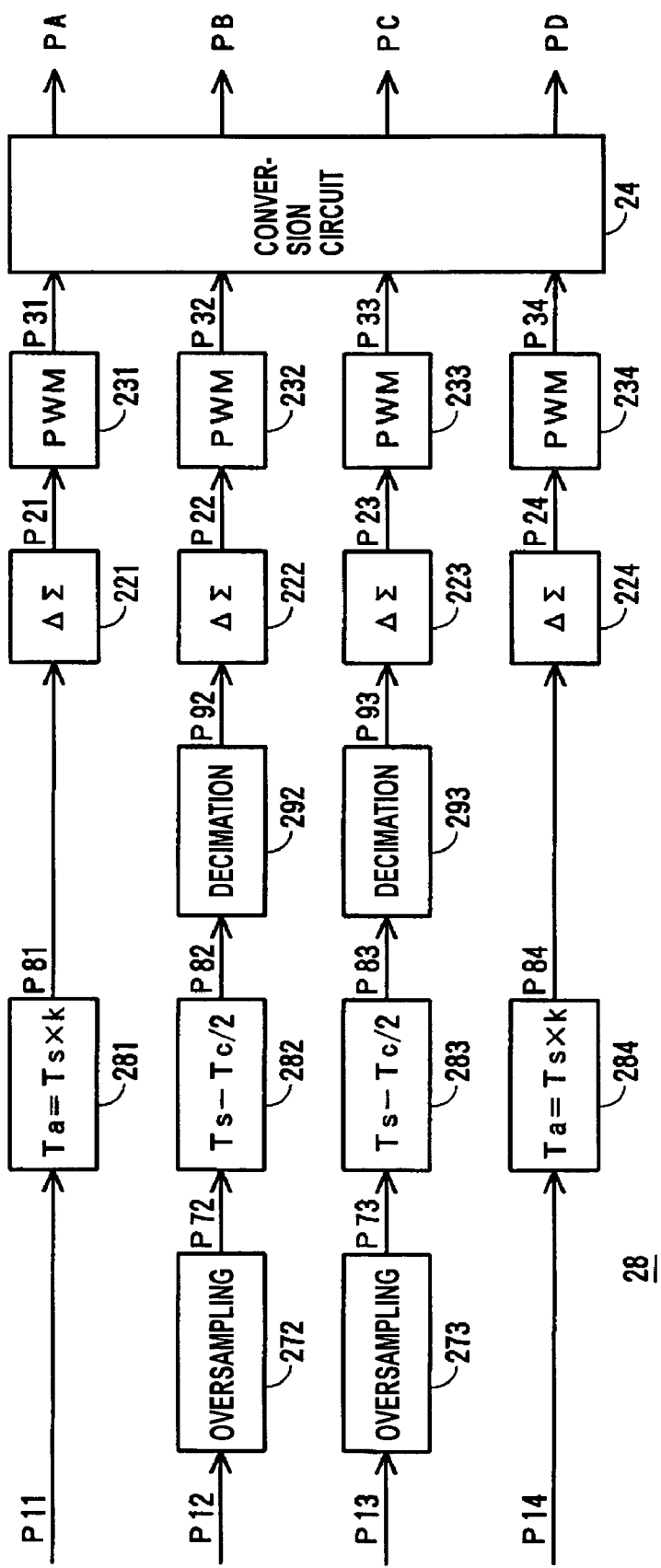
FIG. 10 is a connection diagram showing a part of another embodiment of the present invention.

FIGS. 8 to 10 show examples of a correction circuit for correcting the time delays. In a correction circuit 28 shown in FIG. 8, the digital audio signals P11 and P14 from the delay circuits 211 and 214 are supplied to delay circuits 281 and 284 to be changed to signals P81 and P84 delayed by the period Tc/2. The delay signals P81 and P84 are supplied to the ΔΣ modulation circuits 221 and 224 in place of the original signals P11 and P14.

The signals P11 and P14 are delayed with respect to the signals P12 and P13 by the period Tc/2, and the signals P32 and P33 are delayed with respect to the signals P31 and P34 by the period Tc/2 by the conversion circuit 24. Thus, the signals PA to PD output from the conversion circuit 24 are not delayed with respect to each other. Therefore, the speaker array 10 can be appropriately configured.

However, for such processing, timing signals (synchronizing signals) for the signals P11 and P14 are different from timing signals for the signals P81 and P84 by the period Tc/2. Thus, clock signals of two systems having different phases must be provided for the ΔΣ modulation circuits 221 to 224 and the PWM circuits 231 to 234. This causes a complicated circuit configuration.

The correction circuit 28 shown in FIG. 9 includes oversampling filters 271 and 274 and decimation filters 291 and 294. The oversampling filters 271 and 274 are arranged in the previous stage of the delay circuits 281 and 284, respectively. The decimation filters 291 and 294 are arranged in the subsequent stage of the delay circuits 281 and 284, respectively. The digital audio signals P11 and P14 from the delay circuits 211 and 214 are supplied to the oversampling filters 271 and 274, and signals P71 and P74 that are oversampled at a sampling frequency, which is 32 times the sampling frequency fs of the signals P11 and P14 (fs×32=fc×2=2/Tc), are extracted.

Figure 11:
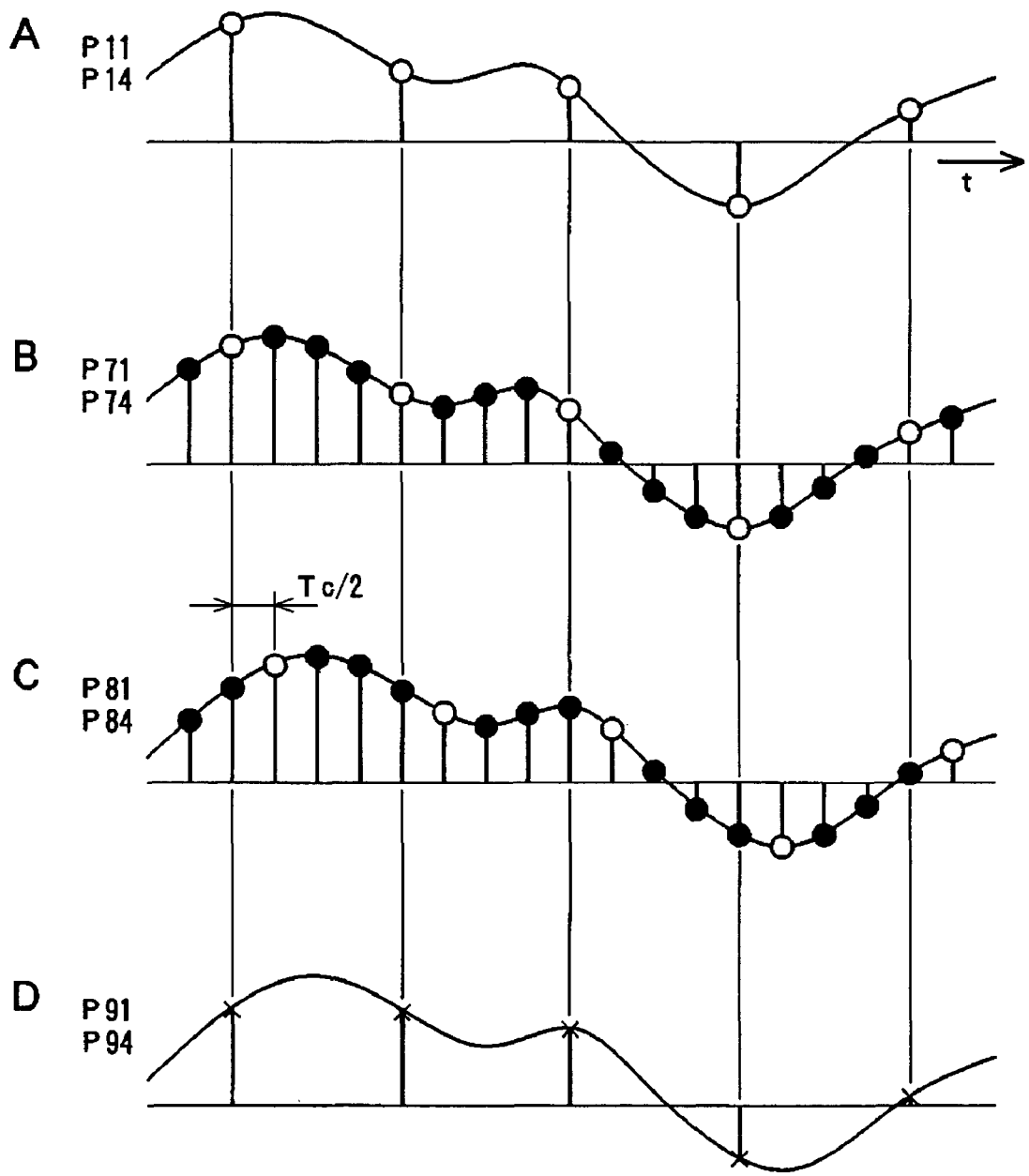
FIG. 11 is an illustration for explaining the present invention.

Part A of FIG. 11 shows the original signals P11 and P14, and Part B of FIG. 11 shows the oversampled signals P71 and P74 (as a matter of convenience of the drawing, a case where a signal is oversampled at a frequency 4 times the sampling frequency fs is shown). The signals P71 and P74 include new sampling signals (represented by black circles) added to the original signals P11 and P14 (represented by white circles).

The signals P71 and P74 are supplied to the delay circuits 281 and 284, and the signals P81 and P84 that are delayed by the period Tc/2, as shown in Part C of FIG. 11, are generated. The signals P81 and P84 are supplied to the decimation filters 291 and 294, and sampling signals at a point in time when the original signals P11 and P14 (white circles in Part A of FIG. 11) exist, from among the signals P81 and P84, are extracted as digital audio signals P91 and P94, which are represented by x marks, as shown in Part D of FIG. 11. The signals P91 and P94 are delayed with respect to the input signals P11 and P14 by the period Tc/2 but are output synchronized by the same timing signal. The signals P91 and P94 are supplied to the ΔΣ modulation circuits 221 and 224 in place of the signals P11 and P14.

Thus, the sounds S1 to S4 output from the speakers SP1 to SP4 are not delayed with respect to each other. Therefore, the speaker array 10 can be appropriately configured. Also, the ΔΣ modulation circuits 221 to 224 and the PWM circuits 231 to 234 can be operated by the same clock signal. Thus, complication of a circuit can be prevented.

In the correction circuit 28 shown in FIG. 10, processing for the signals P11 and P14 and processing for the signals P12 and P13 are arranged opposite to the correction circuit 28 shown in FIG. 9. In other words, the digital signals P12 and P13 are supplied to oversampling filters 272 and 273 to be changed to oversampling signals P72 and P73. The signals P72 and P73 are supplied to delay circuits 282 and 283 to be changed to delay signals P82 and P83. The delay signals P82 and P83 are supplied to decimation filters 292 and 293, and output signals P92 and P93 are extracted. Also, the digital signals P11 and P14 are supplied to the delay circuits 281 and 284 to be changed to the delay signals P81 and P84.

In this case, in the delay circuits 282 and 283, delay of a period Ts−Tc/2 is performed, where Ts represents 1/fs (for example, Ts=1/48 kHz). The signals P92 and P93 are delayed with respect to the original signals P12 and P13 by the period Ts−Tc/2 but are output synchronized by the same timing signal.

In contrast, the delay circuits 281 and 284 perform delay of a period Ta=Ts, and the output signals P81 and P84 are delayed with respect to the input signals P11 and P14 by the period Ts. Thus, the signals P92 and 93 are delayed with respect to the signals P81 and 84 by the period Tc/2.

Since the signals P81 and P84 and the signals P92 and P93 are supplied to the ΔΣ modulation circuits 221 to 224, the digital signals PA to PD output from the conversion circuit 24 are not delayed with respect to each other. Thus, the speaker array 10 can be appropriately configured. In this case, since the delay time Ta is an integral multiple of the sampling period Ts, the signals P81 and P84 and the signals P92 and P93 can be driven at the same timing signal (clock signal).

In the correction circuit 28 shown in FIG. 9 or 10, when time required for resampling processing by the oversampling filters 271 to 274 and the decimation filters 291 to 294 is considered, input signals to the $\Delta\Sigma$ modulation circuits 221 and 224 should be relatively delayed with respect to input signals to the $\Delta\Sigma$ modulation circuits 222 and 223 by the period Tc/2. For example, in the correction circuit 28 shown in FIG. 10, if time Ts×(k−1) (k is an integer) is required for the resampling processing, the delay circuits 281 and 284 perform a delay of a period Ta=Ts×k.

Also, the correction processing for the time delay described above is not necessarily performed in the previous stage of the $\Delta\Sigma$ modulation circuits 221 to 224. The correction processing for the time delay can be performed in any stage as long as the stage is before the conversion circuit 24. Also, since the $\Delta\Sigma$ modulation circuits 221 to 224 also perform oversampling processing, as described above, correction processing for the time delay can be incorporated inside the $\Delta\Sigma$ modulation circuits 221 to 224. In this case, decimation filters can be omitted, and a simpler circuit arrangement can thus be achieved.

Furthermore, delay correction can be arranged by combining functions of the delay circuits 211 to 214 in the speaker array 10 described above. Although the correction circuit 28 has been represented by hardware, the correction processing can be realized by software processing using, for example, a CPU or DSP.

(IV) Connection between Output Amplifiers 25A to 25D and Speakers SP1 to SP4

Figure 12:
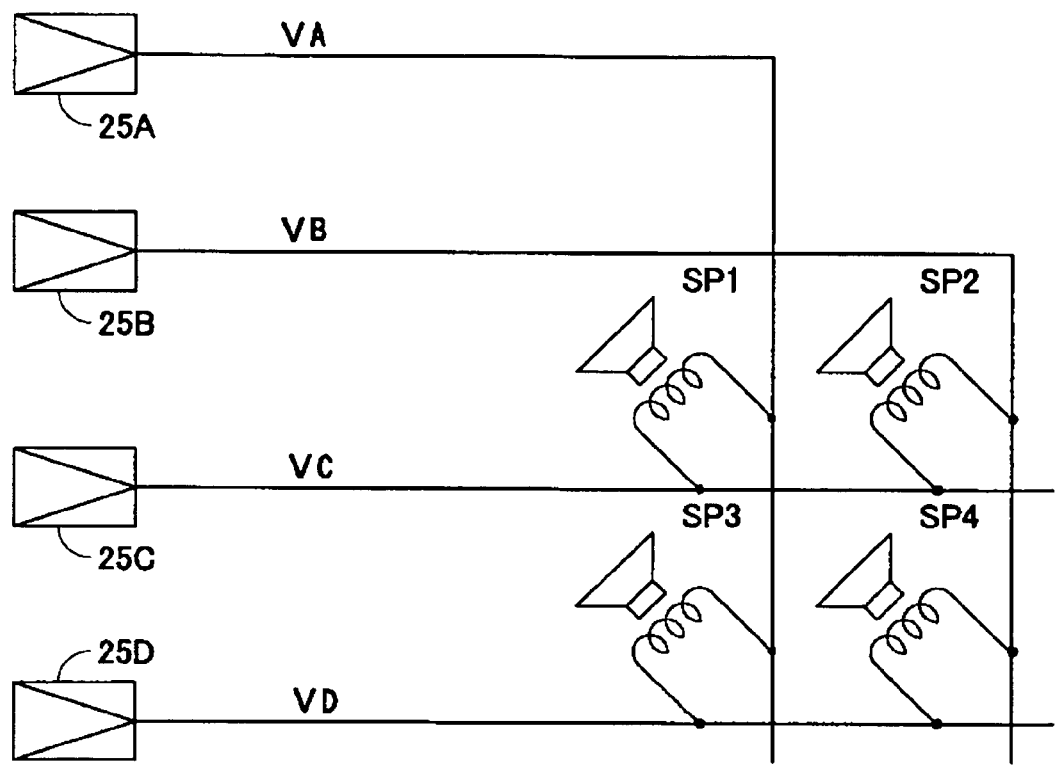
FIG. 12 is a connection diagram showing a part of another embodiment of the present invention.
Figure 24:
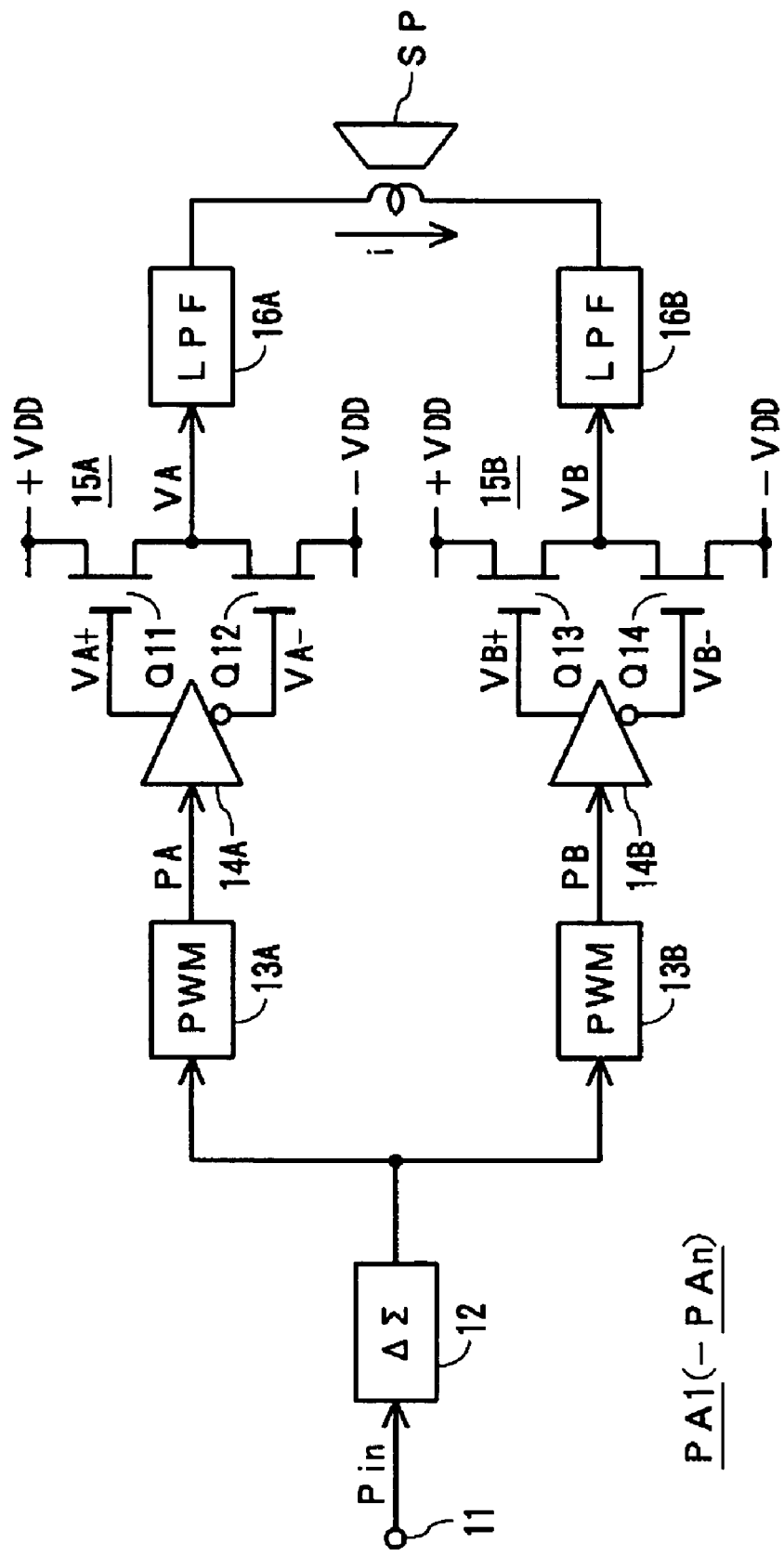
FIG. 24 is a connection diagram for explaining a known technology.
Figure 25:
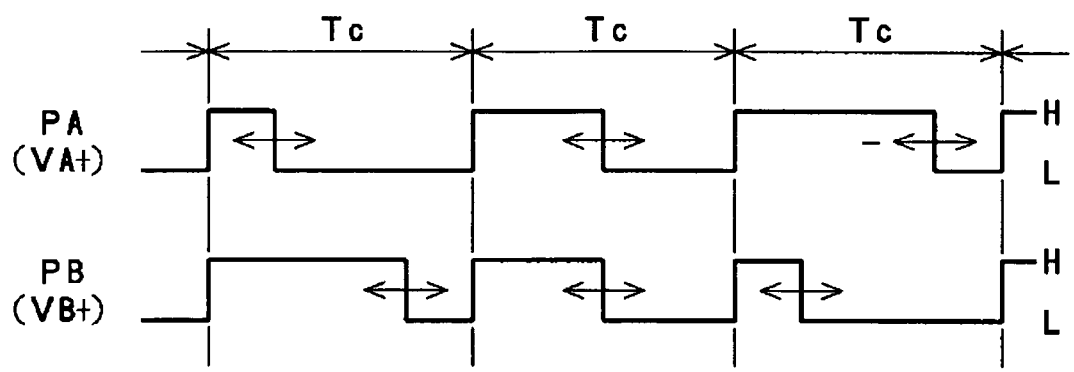
FIG. 25 is a waveform chart for explaining the known technology.
Figure 26:
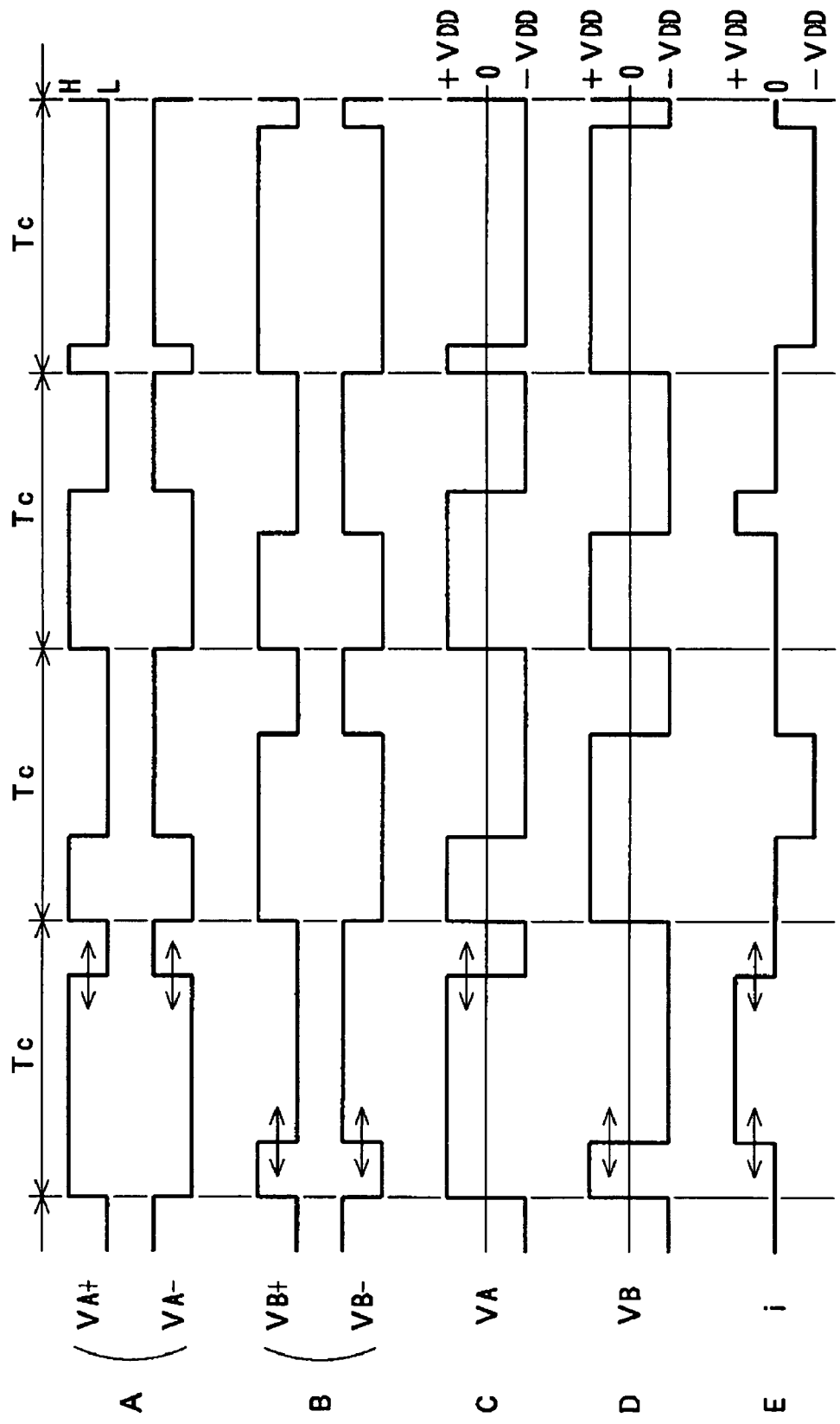
FIG. 26 is a waveform chart for explaining the known technology.
Figure 28A:
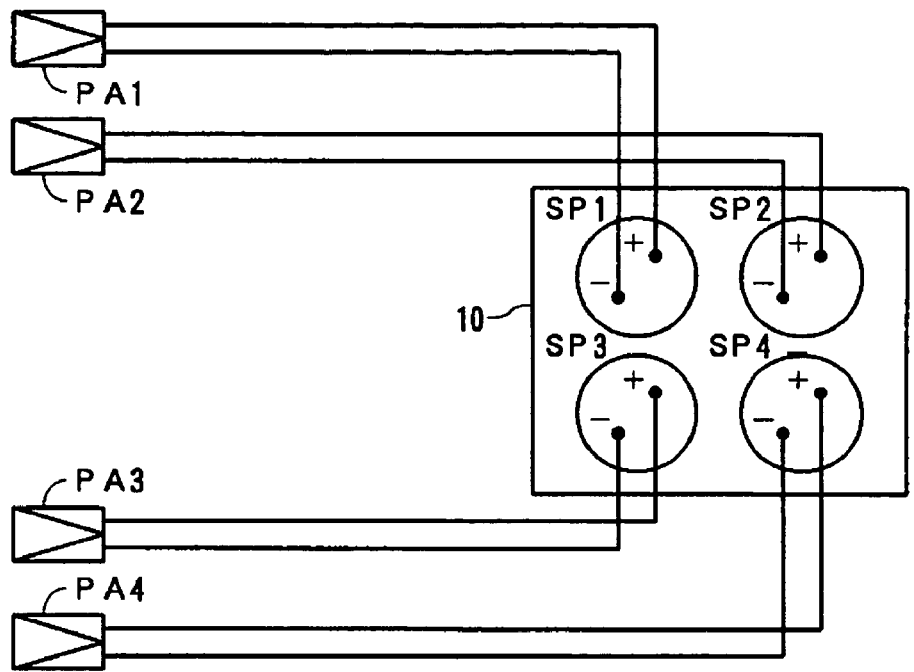
FIGS. 28A and 28B are connection diagrams for explaining a known technology.
Figure 28B:
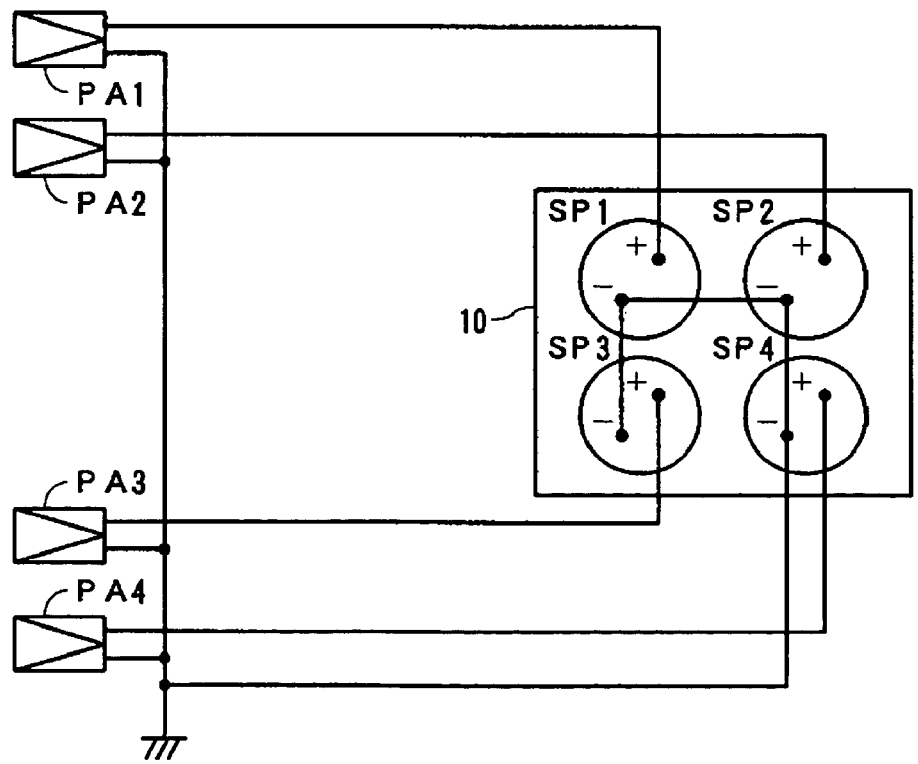
Figure 29:
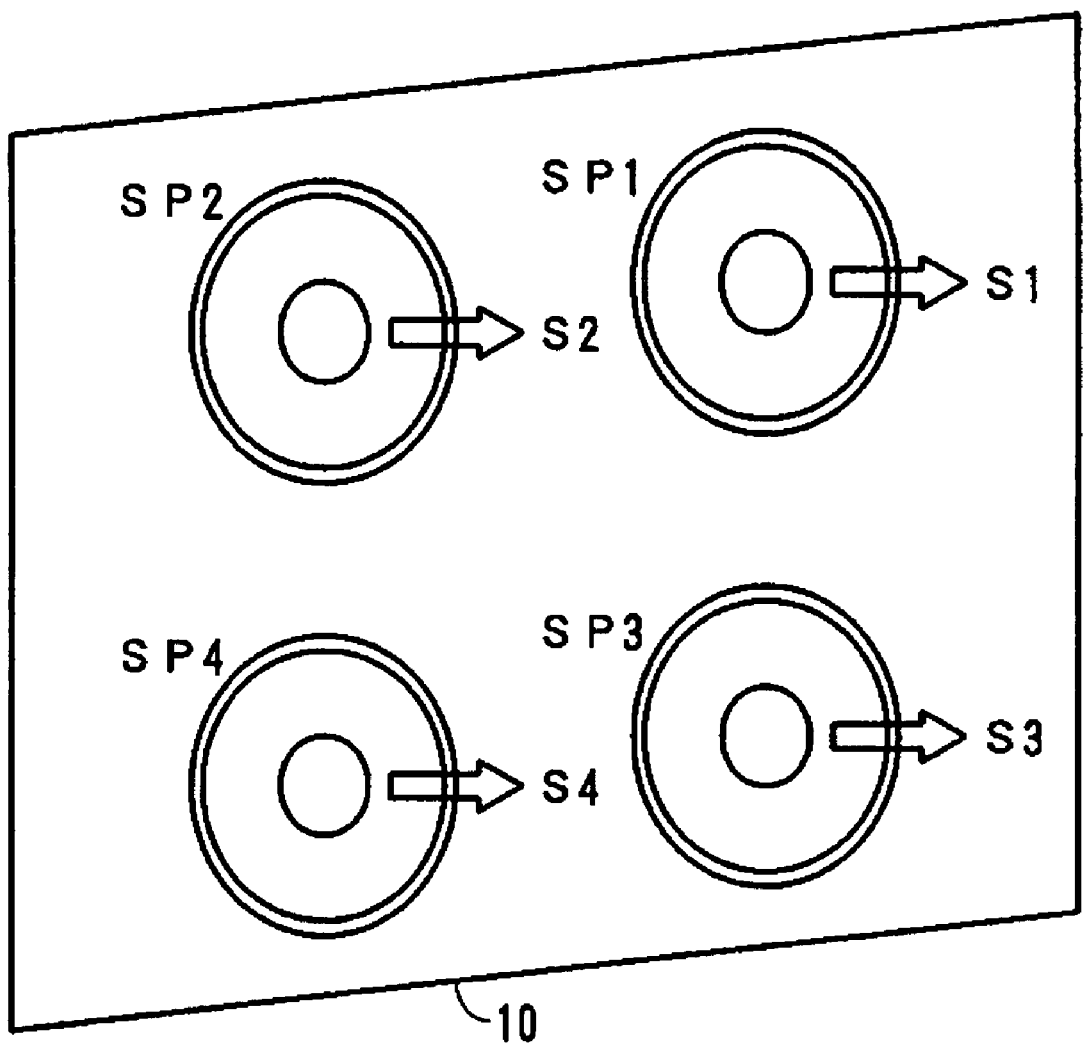
FIG. 29 is a perspective view for explaining the known technology.

In FIG. 1, low-pass filters connected between the output amplifiers 25A to 25D and the speakers SP1 to SP4 are omitted. As shown in FIG. 12, since the speakers SP1 to SP4 are normally dynamic speakers, signal components out of an audible band can be filtered by causing inductance components of a voice coil to operate as a low-pass filter. Obviously, for example, as shown in FIG. 24, low-pass filters may be arranged between output amplifiers and speakers.

Figure 13:
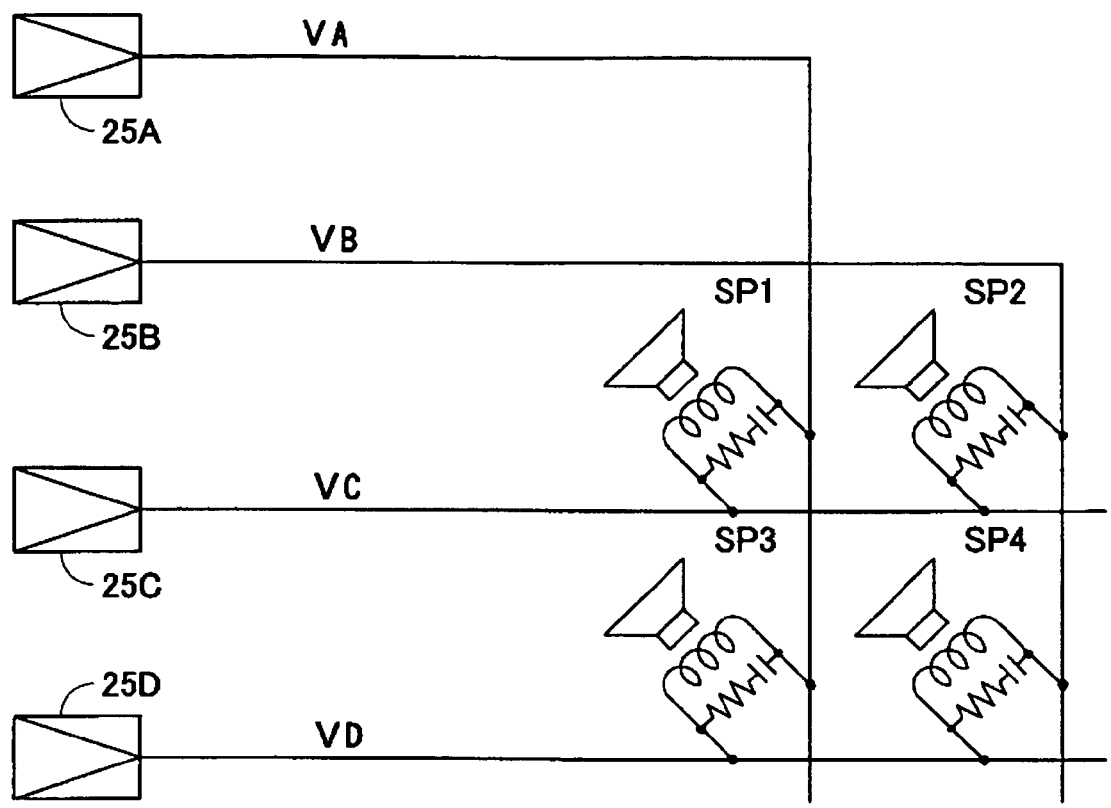
FIG. 13 is a connection diagram showing a part of another embodiment of the present invention.

Also, if the speakers SP1 to SP4 are dynamic speakers, each of the speakers SP1 to SP4 can be regarded as being equivalent to include a resonance system, for example, as shown in FIG. 13. In this case, the vibration velocity of the voice coil increases near a lower resonance frequency, and large back electromotive force is generated. Thus, for example, although the speaker SP1 is differentially driven by the output amplifiers 25A and 25C, the back electromotive force generated in the speaker SP1 is applied to the speakers SP2 and SP3. This may have influence on operations of the speakers SP2 and SP3.

Figure 14:
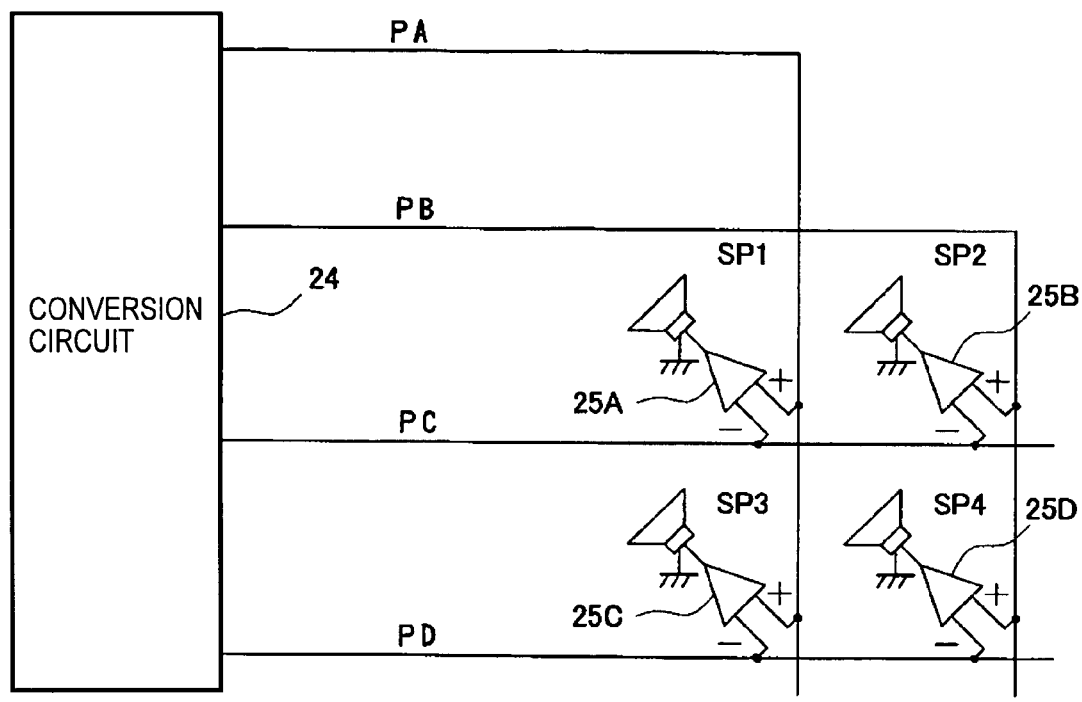
FIG. 14 is a connection diagram showing a part of another embodiment of the present invention.

In order to reduce the influence, the output impedances of the output amplifiers 25A to 25D are reduced. Alternatively, subtraction is performed in voltage signal lines, as shown in FIG. 14. Also, an output amplifier is not connected to a plurality of speakers, as shown in FIG. 14 or 15.

In other words, in FIG. 14, the output amplifiers 25A to 25D are differential input power amplifiers, and non-inverting inputs and inverting inputs of the output amplifiers 25A to 25D are matrix-connected to the PWM signals PA to PD. In this case, the speakers SP1 to SP4 and the corresponding output amplifiers 25A to 25D can be unitized. In this case, difference voltages (VA−VC) to (VB−VD) are supplied to the speakers SP1 to SP4. Accordingly, the speaker array 10 can be realized.

Figure 15:
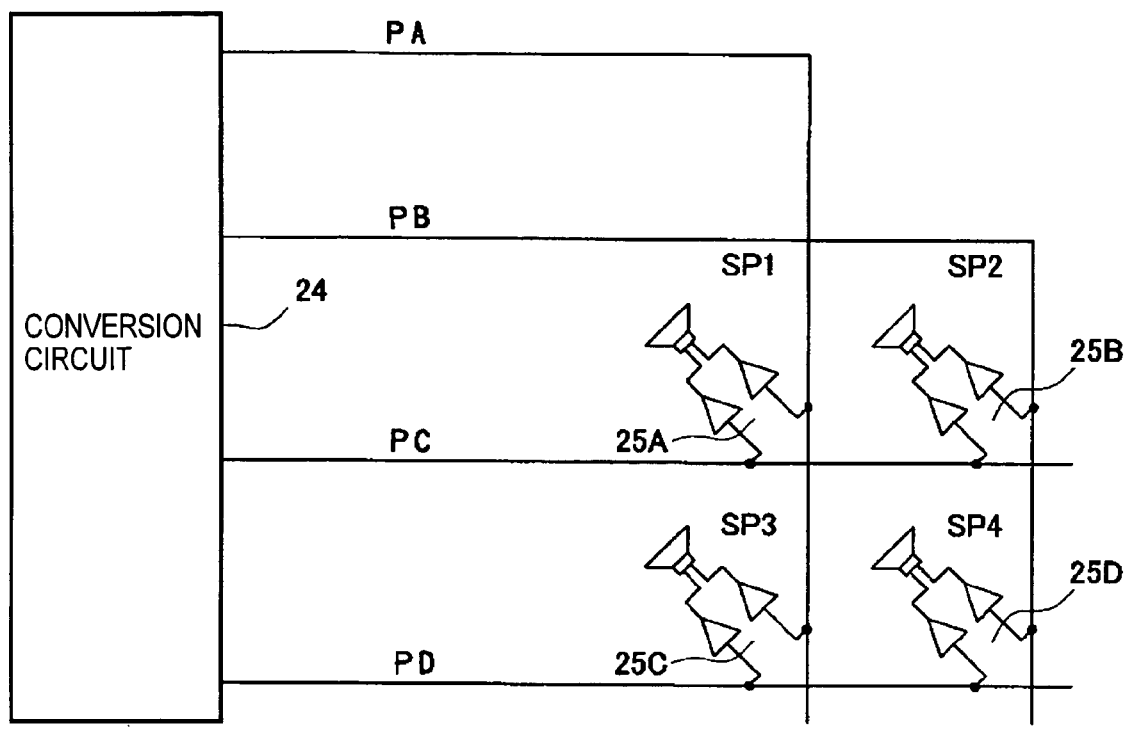
FIG. 15 is a connection diagram showing a part of another embodiment of the present invention.

Also, in FIG. 15, each of the output amplifiers 25A to 25D includes a pair of output amplifiers, and power-amplified signals PA to PD are differentially supplied to the speakers SP1 to SP5.

In the arrangement shown in FIG. 14 or 15, the output signals PA to PD of the conversion circuit 24 are transferred to a power amplifier unit and a speaker array unit using a small number of cables. Also, a signal processing unit is separated from a power amplification unit.

Figure 16:
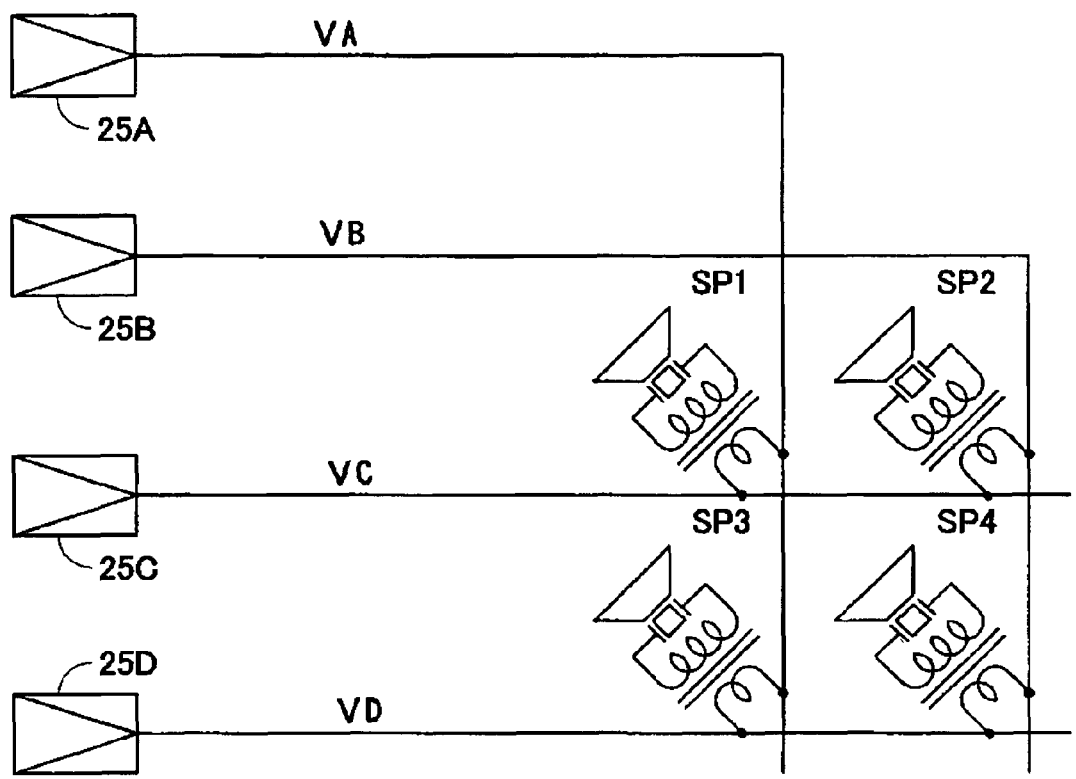
FIG. 16 is a connection diagram showing a part of another embodiment of the present invention.

Also, as shown in FIG. 16, the speakers SP1 to SP4 may be piezoelectric speakers or magnetostriction speakers. In this case, impedance matching can be performed using a transformer or the like.

(V) Number of Speakers=16

Figure 17:
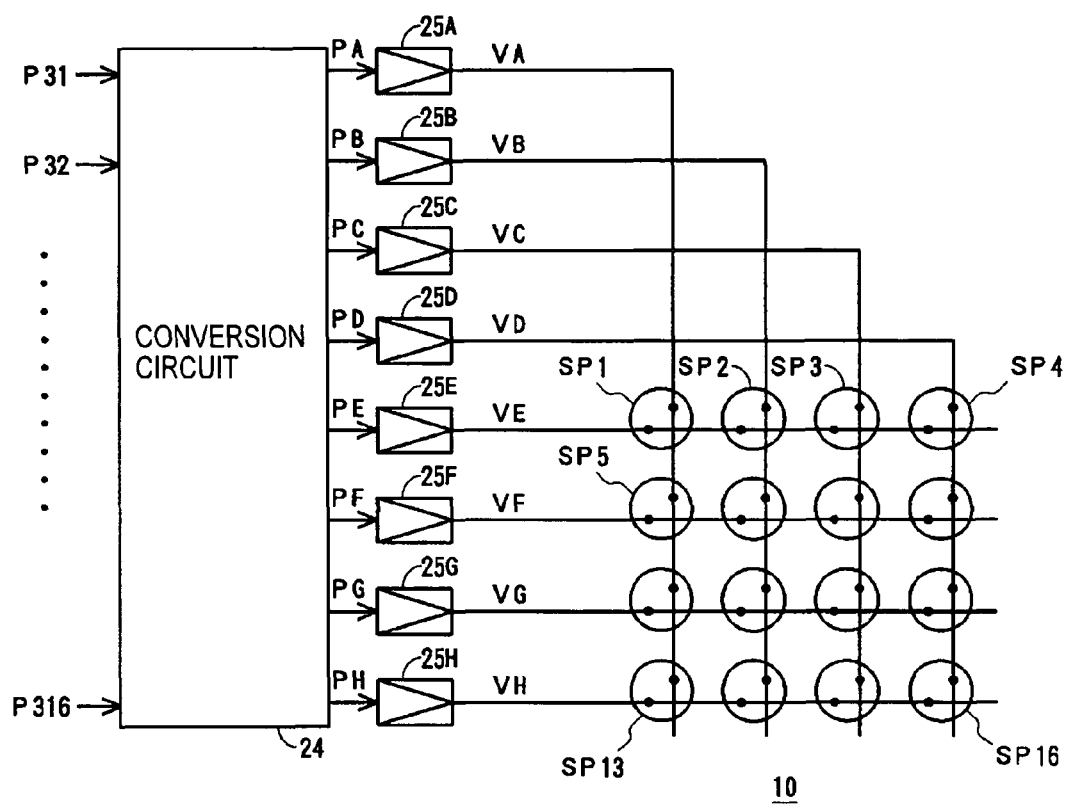
FIG. 17 is a connection diagram showing a part of another embodiment of the present invention.
Figure 18:
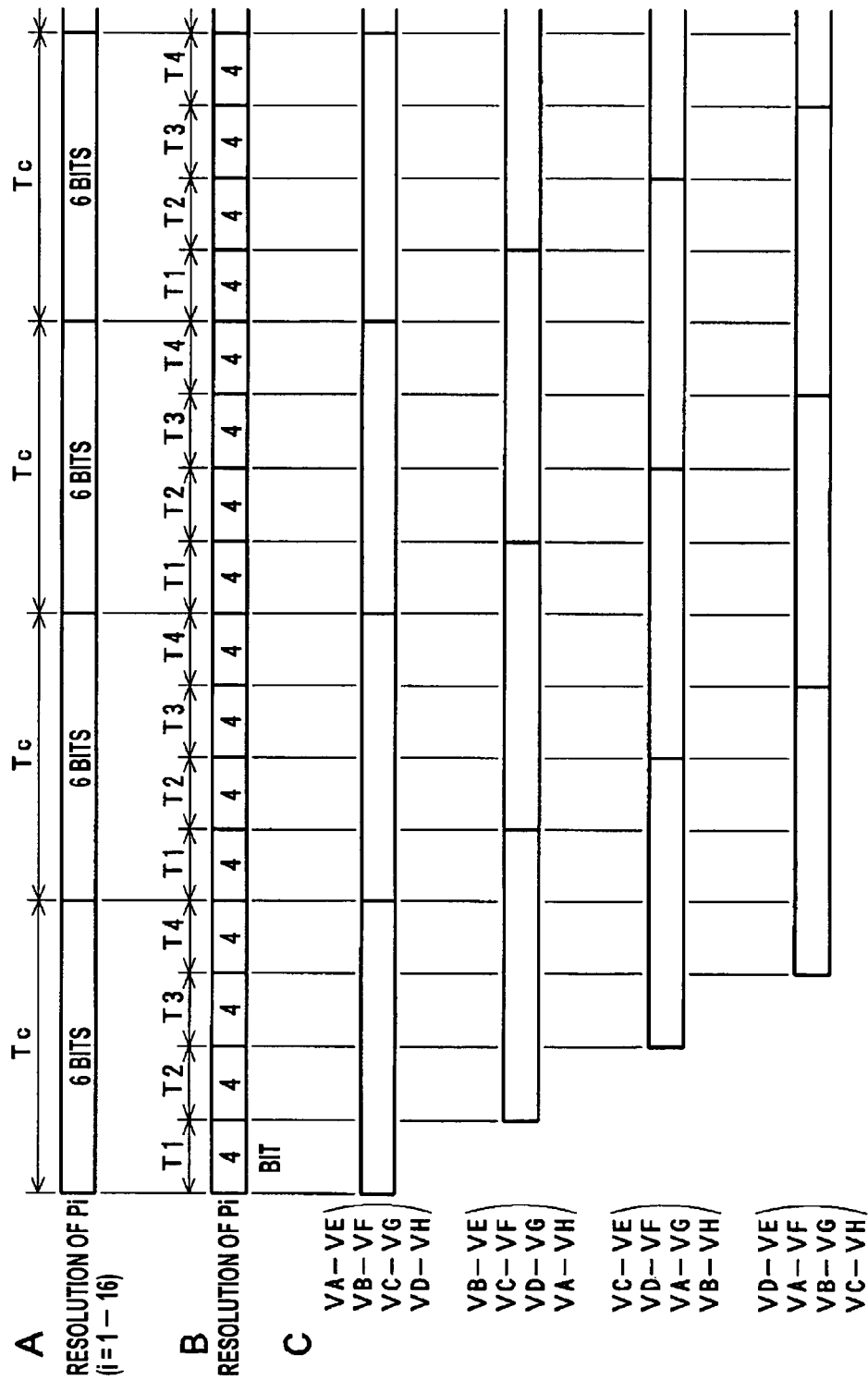
FIG. 18 is an illustration for explaining the present invention.

Although the case where the number of speakers is 4 has been described above, if the number of speakers is 16, arrangements shown in FIGS. 17 and 18 are possible. In other words, as shown in FIG. 17, the speaker array 10 includes four-row by four-column speakers SP1 to SP16. Also, sixteen types of PWM signals Pi (i=31 to 39 and 310 to 316) corresponding to the sixteen speakers SP1 to SP16 are generated, and the PWM signals Pi are supplied to the conversion circuit 24 (not shown).

If, as shown in Part A of FIG. 18, the resolution of the PWM signal Pi at the cycle period Tc is 6 bits, by dividing the cycle period Tc into quarter periods T1 to T4, as shown in Part B of FIG. 18, the resolution of the PWM signal Pi at each of the periods T1 to T4 is 4 bits.

In the conversion circuit 24, the PWM signals Pi are converted into PWM signals PA to PH that change at each of the periods T1 to T4 of the period Tc. The PWM signals PA to PD, from among the PWM signals PA to PH, are supplied, as voltages VA to VD that are class D amplified by the output amplifiers 25A to 25D, to one end of the first- to fourth-column speakers, from among the speakers SP1 to SP16. The PWM signals PE to PH are class D amplified by the output amplifiers 25E to 25H and are supplied to the other end of the first- to fourth-row speakers.

Thus, voltages (VA−VE) to (VD−VH), (VB−VE) to (VA−VH), (VC−VE) to (VB−VH), and (VD−VE) to (VC−VH) whose effective period is delayed by a period Tc/4 are supplied to the speakers SP1 to SP16, as shown in Part C of FIG. 18, and the speakers SP1 to SP16 are driven by the PWM signals P1 to P16, respectively.

In this case, the output amplifiers 25A to 25H are connected to the speakers SP1 to SP16 using 8 (=4+4) speaker cables, so that necessary output voltages can be supplied to the speakers SP1 to SP16.

(VI) Method for Connecting Speaker Array 10

Figure 19:
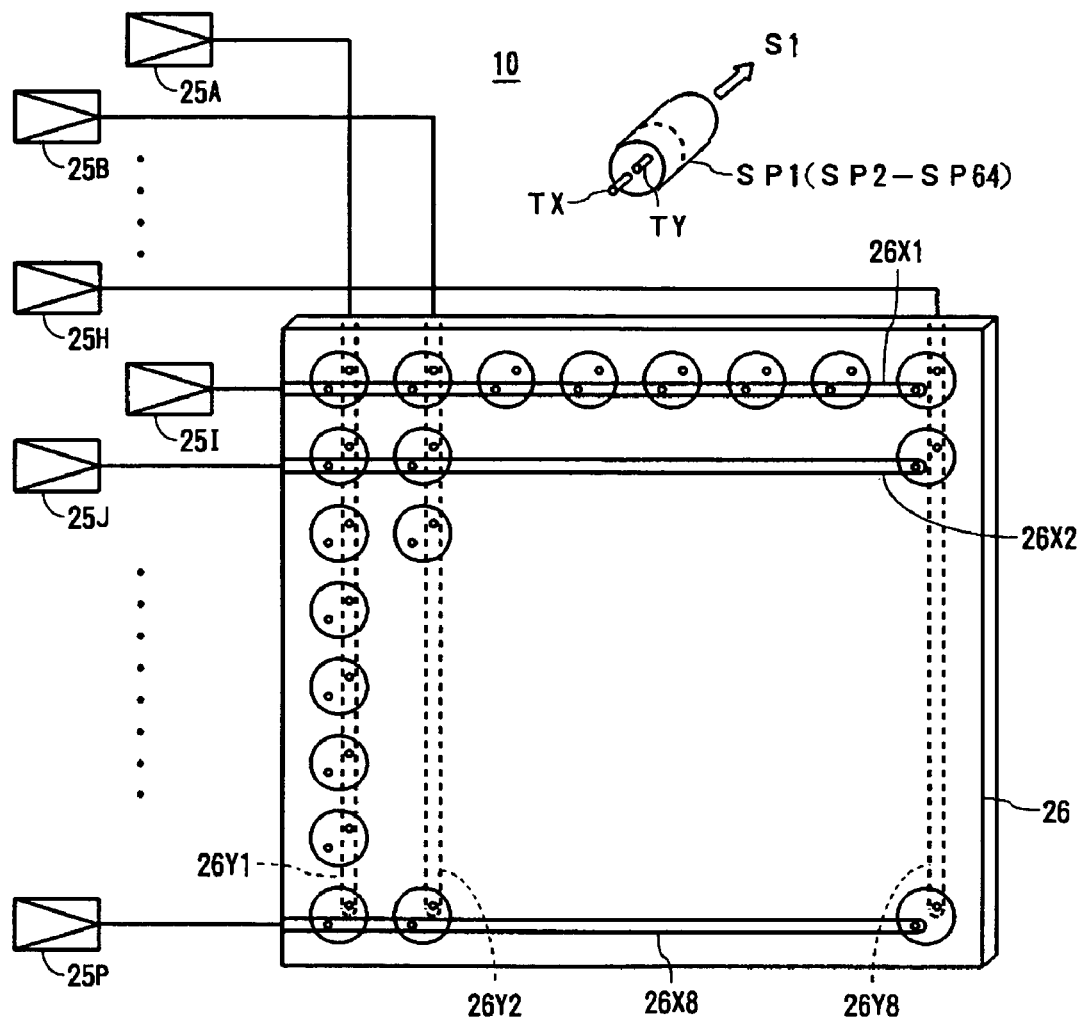
FIG. 19 is a perspective view showing a part of another embodiment of the present invention.

FIG. 19 shows an example of a method for connecting the speaker array 10 including speakers SP1 to SP64 (the number n of speakers is 64). In this example, each of the speakers (speaker units) SP1 to SP64 is arranged in a cylindrical shape as a whole and arranged such that a direction of sound axis of each of the speakers SP1 to SP64 is in the direction of the central axis of the cylinder. Also, connection terminals TX and TY are provided at the rear face of each of the speakers SP1 to SP64.

The speakers SP1 to SP64 are mounted on a double-sided printed board 26 in an eight-row by eight-column matrix. Eight linear wiring patterns 26X1 to 26X8 are arranged in the vertical direction on one face of the printed board 26. Eight linear wiring patterns 26Y1 to 26Y8 are arranged in the horizontal direction on the other face of the printed board 26, as shown by broken lines.

The terminals TX of the speakers SP1 to SP64 are soldered to the wiring patterns 26X1 to 26X8 through through-holes of the printed board 26. The terminals TY are soldered to the wiring patterns 26Y1 to 26Y8 through through-holes of the printed board 26. Actually, since the speakers SP1 to SP64 are fixed to a front baffle of a speaker box, the printed board 26 functions as a flexible board.

With this arrangement, the speakers SP1 to SP64 are matrix-connected by the wiring patterns 26X1 to 26X8 and the wiring patterns 26Y1 to 26Y8 and are unified as a block by the printed board 26.

Sixteen (16=8+8) output amplifiers 25A to 25P are provided in accordance with the number n (n=64 (64=8×8)) speakers SP1 to SP64. Output terminals of the output amplifiers 25A to 25H are connected to the wiring patterns 26Y1 to 26Y8 via cables, and output terminals of the output amplifiers 25I to 25P are connected to the wiring patterns 26X1 to 26X8 via cables. Thus, the number of cables between the output amplifiers 25A to 25P and the speakers SP1 to SP64 can be reduced. Also, connection, assembling, and exchange of units can be easily performed.

Figure 20:
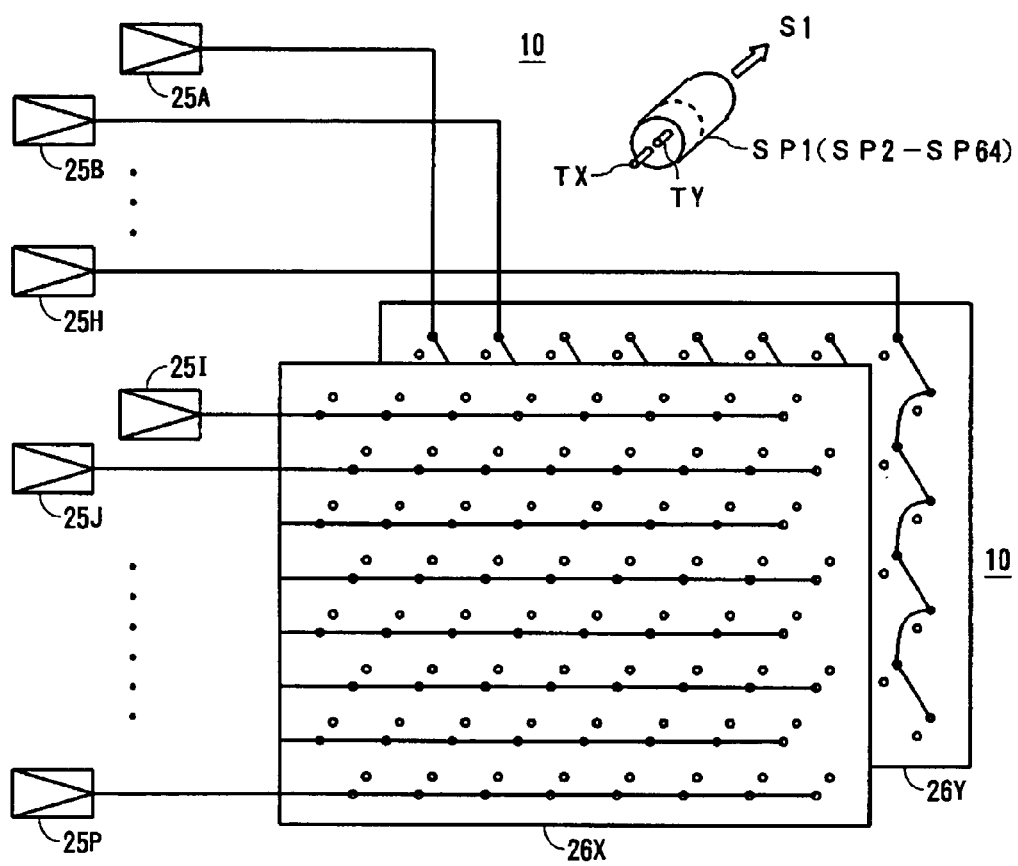
FIG. 20 is an exploded perspective view showing a part of another embodiment of the present invention.

FIG. 20 shows an example of a case where the speaker array 10 includes the 64 speakers SP1 to SP64, as in the example shown in FIG. 19, the intervals between the speakers SP1 to SP64 are reduced, and two single-sided printed boards 26X and 26Y are provided in place of the double-sided printed board 26. In this case, the wiring patterns 26X1 to 26X8 are arranged on the printed board 26X, and the wiring patterns 26Y1 to 26Y8 are arranged on the printed board 26Y.

Speakers in odd rows (odd columns) of the speakers SP1 to SP64 are mounted on the printed board 26X and speakers in even rows (even columns) of the speakers SP1 to SP64 are mounted on the printed board 26Y so as to be shifted from each other by approximately the radius of each of the speakers. The speakers SP1 to SP64 are arranged in a staggered fashion as a whole.

Thus, in this example, the number of cables between the output amplifiers 25A to 25P and the speakers SP1 to SP64 can be reduced, and connection and assembling can be easily performed. Also, since the array pitch of the speakers SP1 to SP64 is less than that of the speaker array 10 shown in FIG. 19, the entire size can be reduced.

(VII) Others

Figure 21:
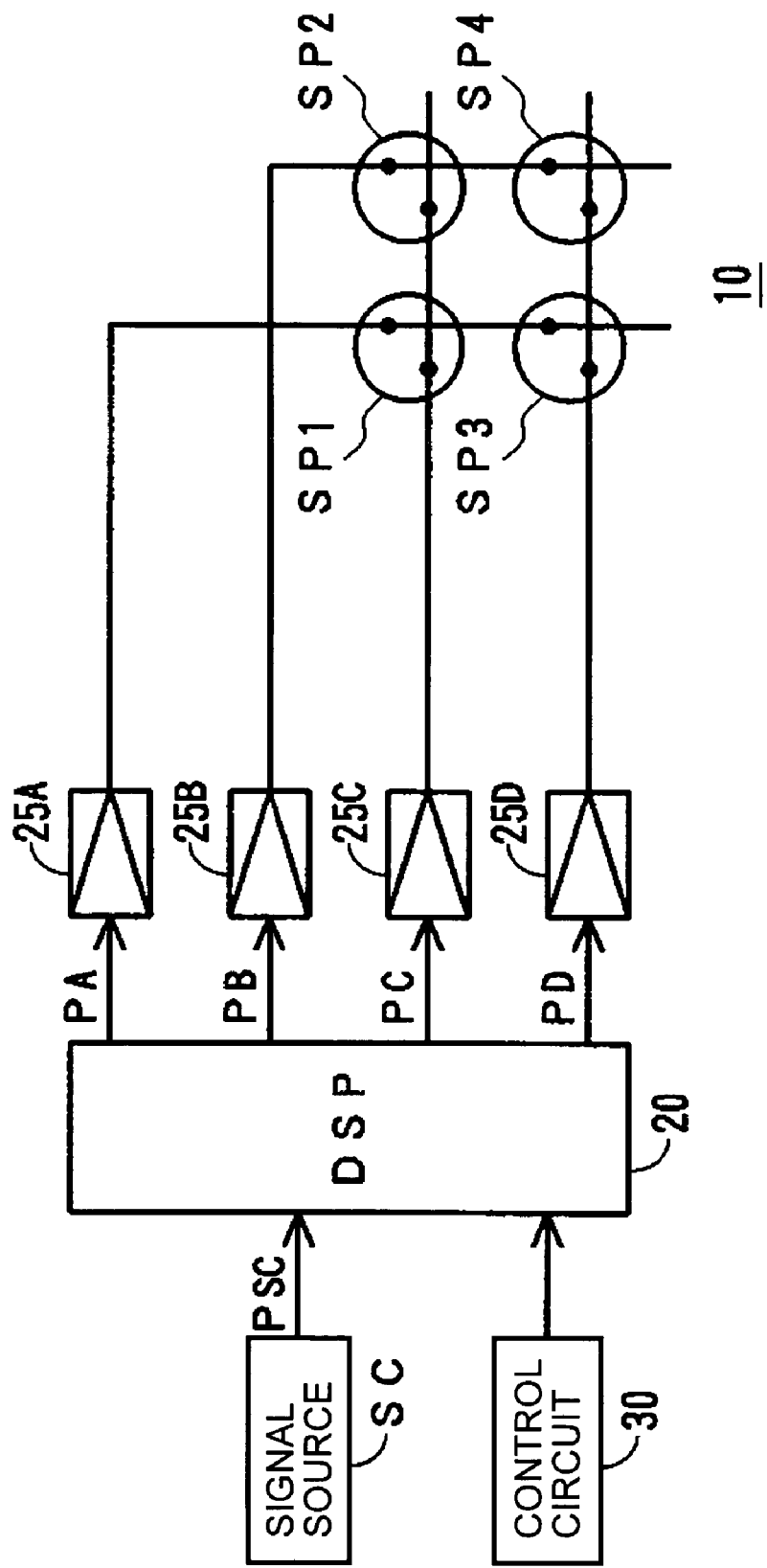
FIG. 21 is a connection diagram showing another embodiment of the present invention.

Although each of the circuits from the delay circuit 211 to the conversion circuit 24 is arranged as an independent circuit in the examples shown in (I) to (IV), the circuits from the delay circuit 211 to the conversion circuit 24 may be arranged as a DSP 20, as shown in FIG. 21.

In this case, in addition to the delay times τ1 to τ4, the levels and phases of the sounds S1 to S4 can also be controlled. Thus, this arrangement is more effective for the speaker array 10. Furthermore, if the DSP 20 is provided, delay times, phases, levels, and frequency characteristics of the digital audio signals P11 to P14 are controlled by control signals from a control circuit 30, so that a playback sound field can be changed. Also, the conversion circuit 24 may convert the digital signals P21 to P24 (without generating the PWM signals P31 to P34) into the PWM signals PA to PD.

Although the speakers SP1 to SP64 are soldered directly to the printed board 26 in the explanation in (VI), sockets may be soldered in place of the speakers SP1 to SP64 so that the speakers SP1 to SP64 are mounted in the sockets. Thus, maintenance can be easily performed.

Also, although a case where the number n of speakers is represented by the equation: n=m×m has been explained, the present invention is not limited to this. The present invention is also applicable to a case where the number n of speakers is represented by the equation: n=p×q (p>q). In this case, q signals having time delays of p systems are generated. Alternatively, for example, a system may be arranged such that the number n of speakers is represented by the equation: n=p×p and only p×q channels may be used.

Furthermore, although the present invention is applied to an amplifier for driving the speaker array 10 in the above descriptions, the present invention is also applicable to a speaker for playing back sound of each channel (each of divided playback frequency ranges) and a drive amplifier of the speaker in a multiway speaker system. In particular, for use of high power public address (PA)/sound re-enforcement (SR), a plurality of speakers may be used in a playback frequency range and a drive amplifier may be individually provided for a speaker. Thus, the number of frequency channels may not be equal to the number of drive amplifiers or speakers.

Also, although the speakers SP1 to SPn are arranged in a matrix in the above descriptions, the present invention is also applicable to a case even where the speakers SP1 to SPn are not arranged in a matrix fashion as long as output amplifiers are connected to the speakers SP1 to SPn in a matrix fashion.

Furthermore, a transmitting and receiving system for transmitting PWM signals output from the conversion circuit 24 using transmission lines, performing subtraction on each of the PWM signals received by the receiver, and obtaining PWM signals corresponding to the original signals can be achieved. This arrangement is effective for a case where the number of channels of signals to be transmitted is larger than the number of channels of transmission lines. In this case, the correction processing for the time delay described above may be performed at transmitting and receiving sides.

What is claimed is:

1. A signal converter for performing conversion processing for converting pulse width modulation signals of p×q channels into pulse width modulation signals of p+q channels, comprising:
   means for obtaining output difference signals of p+q channels by subtraction processing between each of the pulse width modulation signals of p channels and each of the pulse width modulation signals of q channels from among the pulse width modulation signals, wherein the output difference signals correspond to the pulse width modulation signals of p×q channels, and for prereading the pulse width modulation signals of p×q channels such that the pulse width modulation signals of p+q channels do not exceed a given number of bits, p and q being integers equal or greater than 2.

2. The signal converter according to claim 1, wherein a time difference of 1/p of a reference period of the pulse width modulation signals occurs between the pulse width modulation signals of p+q channels due to the conversion processing into the pulse width modulation signals and the subtraction processing.

3. The signal converter according to claim 2, further comprising a correction circuit for correcting the time difference, wherein
   the output difference signals of p×q channels have no time delay between each other.

4. An output amplifying device comprising:
   a conversion circuit for performing conversion processing for converting audio signals of p×q channels into pulse width modulation signals of p+q channels, and for prereading the audio signals of p×q channels such that the pulse width modulation signals of p+q channels do not exceed a given number of bits, p and q being integers equal or greater than 2; and
   p+q output amplifiers to which the corresponding pulse width modulation signals of p+q channels output from the conversion circuit are supplied, wherein the p+q output amplifiers obtain output difference signals of p+q channels by subtraction processing between each of the pulse width modulation signals of p channels and each of the pulse width modulation signals of q channels from among the pulse width modulation signals, wherein the output difference signals corresponding to the pulse width modulation signals of p×q channels are differentially supplied to corresponding p×q speakers.

5. The output amplifying device according to claim 4, further comprising a circuit for performing delay processing on an audio signal supplied from a signal source to generate the audio signals of p×q channels, wherein
the p×q speakers constitute a speaker array.

6. The output amplifying device according to claim 4, wherein:
the p×q speakers constitute a multiway speaker system; and
the audio signals of p×q channels are signals obtained by dividing an audio signal into a plurality of frequency bands.

7. The output amplifying device according to claim 4, further comprising a circuit for correcting a time delay, due to the conversion processing and the differential supply to the speakers, in the audio signals of p×q channels supplied to the conversion circuit.

8. An audio apparatus comprising:
p×q speakers, p and q being integers equal or greater than 2;
a conversion circuit for performing conversion processing for converting audio signals of p×q channels into pulse modulation signals of p+q channels by subtraction processing between each of the pulse width modulation signals of p channels and each of the pulse width modulation signals of q channels from among the pulse width modulation signals to obtain output difference signals of p+q channels, wherein the output difference signals correspond to the pulse width modulation signals of p×q channels, and for prereading the audio signals of p×q channels such that the pulse modulation signals of p+q channels do not exceed a given number of bits; and
p+q output amplifiers to which the corresponding pulse width modulation signals of p+q channels output from the conversion circuit are supplied, wherein
outputs from the p output amplifiers and outputs from the q output amplifiers, from among the p+q output amplifiers, are differentially supplied to the corresponding p×q speakers.

9. The audio apparatus according to claim 8, further comprising a circuit for performing at least delay processing on an audio signal supplied from a source to generate the audio signals of p×q channels, wherein
the p×q speakers constitute a speaker array.

10. The audio apparatus according to claim 8, wherein:
the p×q speakers constitute a multiway speaker system; and
the audio signals of p×q channels are signals obtained by dividing an audio signal into a plurality of frequency bands.

11. The audio apparatus according to claim 8, further comprising a circuit for correcting a time delay, due to the conversion processing and differential supply to the speakers, in the audio signals of p×q channels supplied to the conversion circuit.

12. The audio apparatus according to claim 8, wherein the output amplifiers and the corresponding speakers are unitized.

13. A transmitting and receiving system comprising:
a transmitting apparatus; and
a receiving apparatus, wherein
the transmitting apparatus includes:
a signal conversion unit for performing conversion processing for converting pulse width modulation signals of p×q channels into pulse width modulation signals of p+q channels, and for prereading the pulse width modulation signals of p×q channels such that the pulse width modulation signals of p+q channels do not exceed a given number of bits, p and q being integers equal or greater than 2; and
a transmitting unit for transmitting the pulse width modulation signals of p+q channels obtained by the signal conversion unit; and
the receiving apparatus includes:
a receiving unit for receiving the transmitted pulse width modulation signals of p+q channels; and
a subtraction processing unit for performing subtraction processing between each of the pulse width modulation signals of p channels and each of the pulse width modulation signals of q channels, from among the pulse width modulation signals received at the receiving unit, and for obtaining output difference signals of p×q channels.

14. The transmitting and receiving system according to claim 13, wherein a time difference of 1/p of a reference period of the pulse width modulation signals occurs between the pulse width modulation signals of p+q channels due to the conversion processing into the pulse width modulation signals and the subtraction processing.

15. The transmitting and receiving system according to claim 14, wherein:
at least one of the transmitting apparatus and the receiving apparatus includes a correction circuit for correcting the time difference; and
the output difference signals of p×q channels have no time delay between each other.

* * * * *